United States Patent
Eisele et al.

(10) Patent No.: US 6,325,291 B1
(45) Date of Patent: Dec. 4, 2001

(54) APPARATUS AND METHOD FOR TRANSFERRING INFORMATION BETWEEN A SMART DISKETTE DEVICE AND A COMPUTER

(75) Inventors: Raymund Eisele, Idstein; Axel Burkart, Utting, both of (DE); Paul Barrett, Surrey (GB); Andrew Ryan, Brighton (GB); Peter Holy, Poynings (GB); Shaun Tantony, Brighton (GB)

(73) Assignee: Smarrt Diskette GmbH, Idstein/Taunus (DE)

( * ) Notice: Subject to any disclaimer, the term of this patent is extended or adjusted under 35 U.S.C. 154(b) by 0 days.

(21) Appl. No.: 09/333,997

(22) Filed: Jun. 16, 1999

Related U.S. Application Data

(63) Continuation of application No. 08/867,496, filed on Jun. 2, 1997, now Pat. No. 6,089,459, which is a continuation-in-part of application No. 08/514,382, filed on Aug. 11, 1995, now Pat. No. 6,042,009, which is a continuation-in-part of application No. 08/170,166, filed on Apr. 19, 1994, now Pat. No. 5,584,043.
(60) Provisional application No. 60/036,672, filed on Mar. 11, 1997, now abandoned.

(51) Int. Cl.⁷ .................................................. G06K 19/00
(52) U.S. Cl. .......................................... 235/487; 235/486
(58) Field of Search .................................. 235/492, 493, 235/486, 484, 487

(56) References Cited

U.S. PATENT DOCUMENTS

| | | | |
|---|---|---|---|
| 4,499,510 | * 2/1985 | Harding et al. | 360/77 |
| 4,837,628 | * 6/1989 | Saski | 358/209 |
| 4,890,179 | 12/1989 | Baker . | |
| 4,891,727 | * 1/1990 | Sato et al. | 360/137 |
| 5,438,359 | * 8/1995 | Aoki | 348/207 |
| 5,844,757 | * 12/1998 | Rose | 360/231 |
| 5,877,975 | * 3/1999 | Jigour et al. | 365/52 |
| 5,887,145 | * 3/1999 | Harari et al. | 395/282 |
| 6,042,009 | 3/2000 | Barrett et al. . | |
| 6,089,459 | 7/2000 | Eisele et al. . | |

OTHER PUBLICATIONS internet site: Pacific Magtron Online, LS–120 (120MB) Floppy Drive, copyright 1997; http://www.pacmag.com/ls120.htm.*

* cited by examiner

*Primary Examiner*—Karl D. Frech
(74) *Attorney, Agent, or Firm*—Nixon & Vanderhye P.C.

(57) ABSTRACT

An element which can be plugged into an electronic data processing (EDP) device, for receiving a user card which is equipped with components, including at least one of a processor and/or data memory, a frame having an exterior form, which is designed to accommodate the user card, a first interface for transferring data between the element and the EDP device, and a second interface formed by contacts on the user card and on the frame, for transferring data to and from the user card. The exterior form of the frame is that of a diskette so that it can be inserted into a diskette station of an EDP device. The first interface between the element and the EDP device is designed in a standard fashion, so that data can be transferred using a standard read/write device already present in the diskette station of the EDP device. The frame carries a battery for supplying current via the interface to the components located on the user card, if required, and carries an additional processor and data memory for providing the element with additional processor and storage capacity.

32 Claims, 11 Drawing Sheets

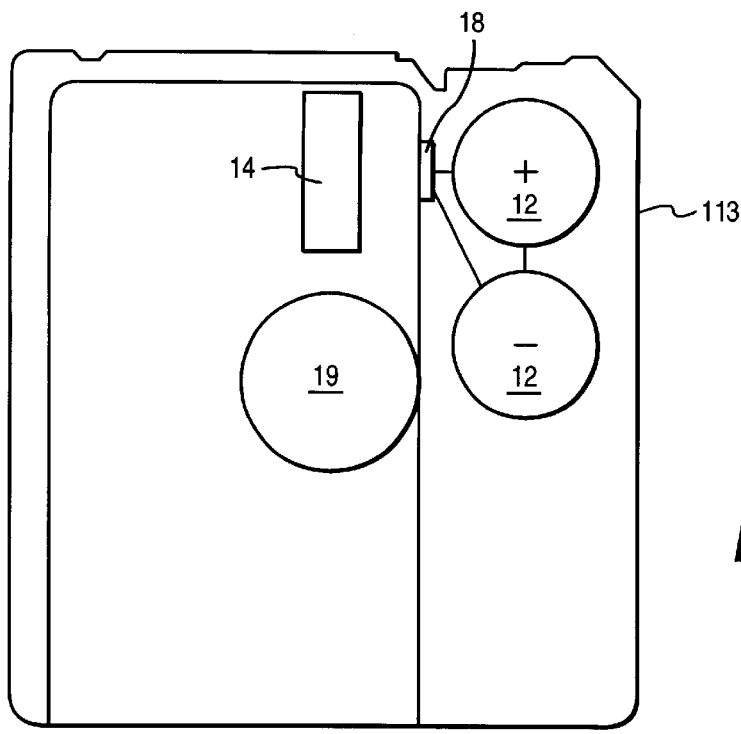
Fig. 10a
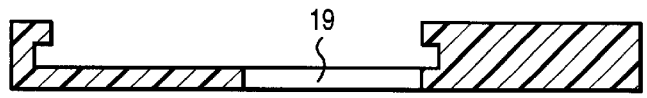
Fig. 10b
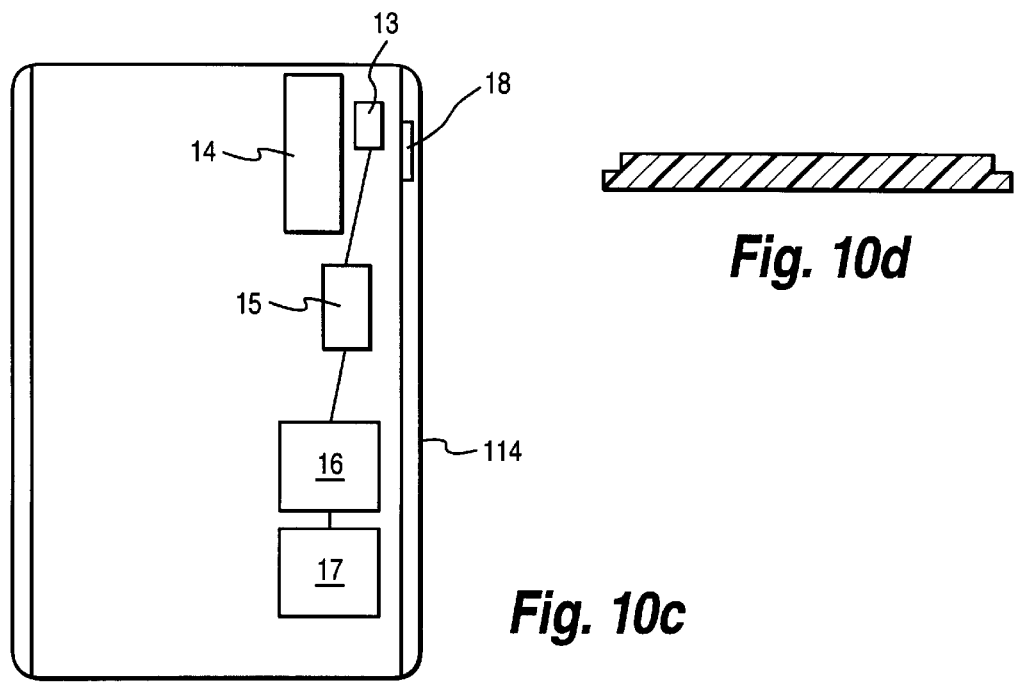
Fig. 10d
Fig. 10c

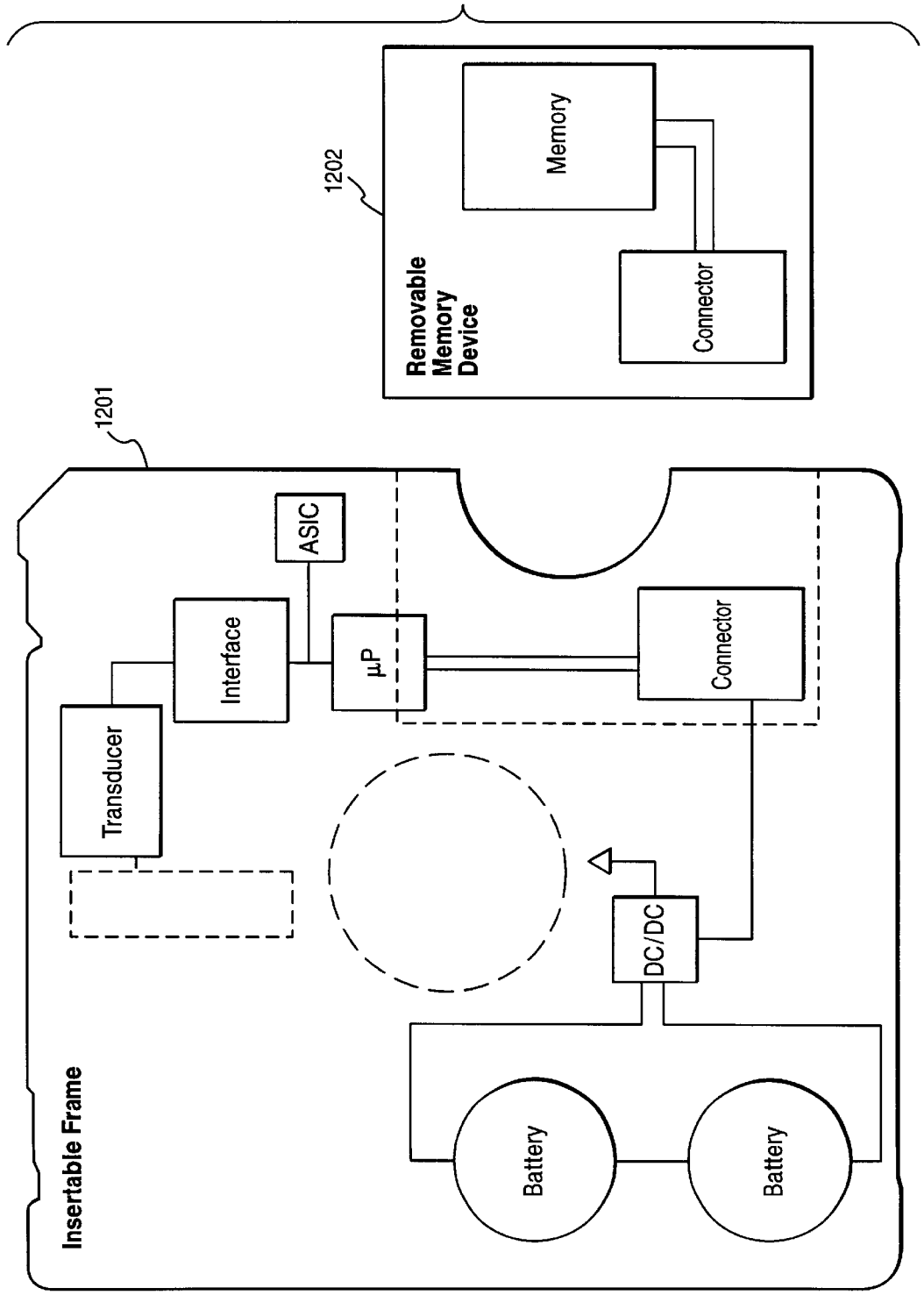

APPARATUS AND METHOD FOR TRANSFERRING INFORMATION BETWEEN A SMART DISKETTE DEVICE AND A COMPUTER

CROSS-REFERENCE TO RELATED APPLICATIONS

This application is a continuation of application Ser. No. 08/867,496, filed Jun. 2, 1997 now U.S. Pat. No. 6,089,459, which is a continuation-in-part of commonly assigned application 08/514,382 filed Aug. 11, 1995, now U.S. Pat. No. 6,042,009, entitled "POCKET INTERFACE UNIT (PIU) FOR A SMART DISKETTE" which is a continuation-in-part of commonly assigned application 08/170,166 filed Apr. 19, 1994 now U.S. Pat. No. 5,584,043 entitled "APPARATUS HAVING A SMART CARD ACCOMMODATED BY A DISKETTE FRAME CONTAINING PROCESSOR MEMORY AND BATTERY POWER FOR INTERFACING WITH A STANDARD DISK DRIVE," each of which are hereby incorporated by reference. This application claims the benefit of U.S. Provisional Application No. 60/036,672, filed Mar. 11, 1997, now abandoned.

This application is related to the following interrelated and commonly assigned applications and patents, the subject matter of which is hereby incorporated by reference:

application Ser. No. 08/514,382 filed Aug. 11, 1995, U.S. Pat. No. 6,042,009 entitled "POCKET INTERFACE UNIT (PIU) FOR A SMART DISKETTE";

application Ser. No. 08/420,796 pending filed Apr. 12, 1995, entitled "SMART DATA STORAGE DEVICE" which is a continuation of Ser. No. 07/947,570 (abandoned), which is a continuation of 07/448,093, now U.S. Pat. No. 5,159,182;

application Ser. 08/479,747 filed Jun. 7, 1995, entitled "COMMUNICATION INTERFACE ELEMENT RECEIVABLE INTO A MEDIA DRIVE" which is a continuation of 07/712,897, now U.S. Pat. No. 5,457,590;

pending provisional application No. 60/036,672 filed Mar. 11, 1997, entitled "PROCESS FOR OPERATING A SMART CARD ADAPTER DEVICE";

U.S. Pat. No. 5,471,038 entitled "SMART-DISKETTE READ/WRITE DEVICE is HAVING FIXED HEAD"; and U.S. Pat. No. 5,584,043 entitled "APPARATUS HAVING A SMART CARD ACCOMMODATED BY A DISKETTE FRAME CONTAINING PROCESSOR MEMORY AND BATTERY POWER FOR INTERFACING WITH A STANDARD DISKETTE DRIVE."

BACKGROUND OF THE INVENTION

1. Field of The Invention

The present invention relates generally to the field of computer user interfaces, and to a pocket user interface (PIU) device which is adapted to accommodate and/or interface with a smart diskette. The present invention also relates to an element for insertion into a diskette drive, which may receive a processor and/or memory card therein.

2. Background Information

A smart diskette is a device having the external shape of, for example, a standard 3½" diskette, and which contains therein, instead of and/or in addition to a magnetic medium, interface and processing circuitry for providing particular functionality to the device.

The smart diskette circuitry includes an interface for transferring data between other components on the device and a magnetic head of a standard disk drive. In various forms, the smart-diskette device also includes a microprocessor for controlling the device and performing various tasks, such as data encryption, and memory, in the form of RAM (random access memory), ROM (read only memory), EEPROM (electronically erasable/programmable read only memory), and/or Flash memory devices, for storing programs and data.

U.S. Pat. No. 5,159,182, and copending application Ser. No. 08/420,796 (Atty Docket No. LWBR 0006C1), disclose a smart-diskette insertable element with magnetic interface, processor, power supply and optional display and keypad to be inserted into a standard 3½" floppy disk drive, for example, of a host computer, i.e., electronic data processing (EDP) equipment, such as a desk-top personal computer (PC) or notebook computer.

An exemplary embodiment of the smart-diskette insertable element disclosed in the above-mentioned patent and application, has a processor with a built-in memory and an interface designed in such a way that it is possible to exchange data between the element's processor and the EDP equipment's disk drive read/write head A driver converts signals coming from the element's processor into the required magnetic form at the interface, and converts signals coming from the external EDP equipment through the interface into the required form for the processor.

A significant advantage of this smart diskette insertable element is that, by virtue of its insertability into a standard disk drive and interfaceability therewith, it is possible to carry-out operations with the element's processor, such as encryption and decryption of data or verification of user identity, without requiring a special interface or plug-in board which might be suitable only for a particular computer system.

Another advantageous feature of the smart diskette insertable element is its ability to store additional data and/or programs in on-board memory connected with the element's processor. This considerably increases the potential areas of application for the element.

The smart diskette element disclosed in the above patent and application, may also be equipped with a battery power source supplying power to other electronic components within the element The interface of the smart diskette insertable element is designed to allow data to be relayed through it, between the element's processor and the read/write head of the disk drive. One way of achieving this is to place an electromagnetic component, e.g., one or more coils, in the vicinity of the interface which is able to generate magnetic field information equivalent to that generated by the magnetic disk of a standard, e.g., floppy, diskette. In this way the interface is therefore able to simulate the magnetic disk. This property of the interface allows data to be transferred from the element's processor to the EDP-equipment, e.g., data which enables user identification to be verified, thereby providing security to the EDP equipment. The interface is receives signals coming from the EDP-equipment via the disk drive write head and passes these on to the element's processor. This exchange of data makes a variety of operations possible, as would be recognized by one skilled in the art.

The smart-diskette disclosed in the above patent and application may also be provided with an alpha-numerical display and/or keypad. The keypad and/or display may be in the form of a separate module attached physically and electrically to the smart diskette element so that it is visible even when the smart-diskette is inserted in the disk drive of a computer terminal.

As processor capabilities expand and memory devices with increasing capacity become smaller, the smart diskette takes on the potential for more and more useful applications.

Related U.S. Pat. No. 5,471,038 discloses a read/write unit with a read/write head and optional electrical contacts, but without the standard disk driving and head moving parts, for use in a desk-top PC or notebook computer to communicate with a smart diskette. By eliminating the drive motor and moving read/write heads, energy otherwise expended by the use of such moving parts is avoided.

Further, such a read/write unit, since it eliminates bulky drive and head motors, can be made more compact than a standard disk drive, thereby reducing the overall size requirements for the computer in which it is installed.

Such a read/write unit in conjunction with a smart diskette operating as a security device can also provide protection from unauthorized use of the computer in which it is installed. Protection against access to the computer, and consequently, any network to which it is attached, is achieved with the aid of the smart diskette which contains corresponding authorization codes and the like, but which can also be used with standard commercially available, e.g., 3½" drives.

Since a normal diskette cannot operate with the read/write unit, an unauthorized user cannot exchange data with the read/write unit. The optional electrical contacts can be used to power the smart diskette components from the computer device in which the read/write unit is installed, and/or to provide another path for data exchange.

Possible applications and advantages of such a read/write unit include providing convenient add-on memory without the need of a special interface, such as PCMCIA. In this regard, the read/write unit operates with a smart diskette having on-board memory of several megabytes, for example.

The read/write unit is particularly useful with notebook and notepad type computers, where energy conservation and weight are very important, since the read/write unit does not have bulky energy consuming moving parts.

This read/write unit can be used with conventional EDP devices as well, e.g., desk-top personal computers, to provide additional security, functioning as a 3½" drive which can be used only with smart diskettes, and not with conventional diskettes.

Simple data exchanges between conventional 3½" drives and notebooks/notepads equipped with the energy conserving read/write unit are facilitated using smart diskettes. In addition, higher data flow rates than with conventional floppy drive units, e.g., up to several Mbit/sec, are achievable with this read/write unit Pocket calculators and diary devices are known and gaining acceptance with busy executives, for example. However, such devices have numerous limitations and disadvantages. For example, although such devices can interface with a desk-top computer to download application programs and/or data, for example, or to upload data entered on the pocket device to the desk-top computer, to do so currently requires inconvenient cabling, and/or a special interface unit, e.g., PCMCIA, with associated costs.

In addition, such pocket devices are generally limited to a single special application, such as a phone directory, or a golf-handicap calculator, and do not provide the range of capabilities of a notebook computer, for example. Although some pocket devices are "programmable," this is often achieved only through the insertion and removal of a limited set of specially made ROM integrated circuit modules available from the manufacturer of the pocket device.

Pocket-sized pagers and cellular telephones are also known. However, these respective devices do not generally have the capability of functioning as anything except a pager or telephone, that is, they are generally devices which are dedicated to a single function.

Therefore, the fully-equipped, fully-functional executive may be burdened by having to carry around a variety of separate devices, which further disadvantageously cannot readily interface with one another.

From the earlier German patent registration P39 03 454 A1 a component (Smartdiskette) is known which can be inserted into an EDP (electronic data processing) installation. This component is designed as a diskette and equipped with a special interface. The interface is designed in such a manner that a data transfer can be performed between a processor located in the diskette and the EDP installation via the already existing read/write device. The particular advantages affiliated with this feature are based on the fact that data can be transferred between the processor of the diskette and the EDP installation without any additional interfaces being required. One characteristic of the interface section, the converter, is known from the German Patent registration P40 36 336.83-53.

SUMMARY OF THE INVENTION

The underlying task of the present invention is to realize a multitude of application possibilities of the component.

This task is fulfilled in that the element (diskette), which can be plugged into an EDP installation, consists of two components which can be plugged together. One component possesses the external shape of a diskette and serves as a frame to accommodate the second component, which contains all or some of the electronic units.

Some of the electronic components can also be located inside the frame.

The advantages of this measure are that the dimensions of the second component are smaller than the dimensions of the diskette. The second component has the dimensions a minichip card, a chip-card (0.8 mm or 2 mm thick) or a card with the dimensions 55×60×3 mm. These cards can be transported without difficulty in a purse or wallet. Consequently the advantages of the element as stated in the German patent registration P39 03 454 A1, are combined with the advantages of a chip card. The disadvantages of a chip card, such as limited memory and processor capacity as well as the fact that it requires a special read/write device, are eliminated by this invention. The functions of the Smartdiskette, as stated in the German patent registration P39 03 454 A1, can also be performed using this invention.

As is well know in the field, there are many types of so-called smart cards in widespread use, some of which contain sophisticated processing capabilities, some of which contain only memory storage capabilities, e.g., flash memory, and a range of cards in between with a more or less rudimentary processor on-board for handling primarily communications and/or memory management tasks. The present invention, therefore, is not intended to be limited to use with any particular type of processor/memory card among the many types available and under development.

An additional function is described here as an example. Here we are referring to a patient's data card as set down in the German disclosure provision DE 35 34 638 A1. The disadvantage of the patient data card in the specified form of a standard commercial diskette is that the personal data related to a patient can be read at any time as the data stored on commercially available diskettes are uncoded. A further disadvantage lies in the dimensions of a standard diskette. It cannot be transported comfortably like a chip card in a purse or wallet.

As is also stated in the above-mentioned disclosure provision, patient data can be stored on magnetic stripe cards or chip cards. The magnetic strip cards have the advantage of small dimensions, but the same disadvantages as standard commercial diskettes with respect to the easy reading of personal data The chip card does not have this disadvantage. Confidential data can be safely stored on this medium. They can only be accessed when the correct secret code has been previously entered. The disadvantages of a chip card are that an insufficient amount of patient data can be stored on this medium and that special read/write devices are required.

With this invention the disadvantages stated are completely eliminated. The diskette drive of any personal computer and the magnetic interface located in the element itself serve as the interface for the reading and writing of the patients data. Depending on the model of the pluggable board in the frame, several megabytes can be stored there. Reading and writing of the data is only then permitted by the processor—also integrated into the frame once a secret access code has been entered and this has been identified as correct by the processor.

The present invention pocket interface unit (PIU), in conjunction with a smart diskette having ever increasing capabilities, solves the above-mentioned problems and disadvantages of the current portable devices, and provides new and useful applications for the smart diskette.

The PIU is a small portable device which provides a smart diskette with various user interfaces. For example, the PIU can provide the smart diskette with a display, buttons, a keypad or keyboard, a mousepad or trackball, etc.

The PIU can farther provide peripheral interfaces, for example, infrared (IR) communications for a printer, mobile (cellular) telephone and/or wired telephone, short range electro-magnetic receiver for heart-rate monitor, cyclometer, etc.

The PIU can itself provide peripheral functions, such as a modem, a mobile (cellular) telephone (data and/or voice), loudspeaker, microphone, etc.

One advantageous aspect of the PIU device is that it is configured as a portable pocket-sized device, and allows a smart diskette, which has had data and programs downloaded from a PC via the standard 3½" floppy diskette drive, for example, to be used for various applications away from the PC.

A further advantage is that, subsequent to use away from a PC, any new data entered or data modified in the smart diskette via the PIU can be uploaded into almost any PC and used, e.g., stored, processed, communicated, etc., by a PC application program.

Advantageously, the PIU device incorporates electrical contacts and/or a read/write unit without energy consuming moving parts, e.g, disk drive motor and/or head moving motor, providing a way to store data entered remotely, while on an airliner, for example, to a smart diskette, the data being later transferred to a portable or desk-top PC from the smart diskette.

By providing a portable device which incorporates a variety of peripheral functions, the need of an executive to carry multiple devices to be fully-equipped is substantially reduced or eliminated.

Flexibility is enhanced with the PIU and smart diskette combination which advantageously provides a number of pocket size electronic devices, e.g., computers, organizers, games, fitness/sports performance monitors, pagers, etc.

Advantageous connectivity through a simple interconnection via a standard 3½" floppy diskette drive to almost any PC is achieved with the PIU according to the present invention.

Advantageous portability is provided by the design in which the PIU with smart diskette can fit into a coat or shirt pocket to be carried and used practically anywhere.

Advantages, details and application possibilities of this invention are to be illustrated on the basis of the schematically depicted examples in the figures.

BRIEF DESCRIPTION OF THE DRAWINGS

The above and other features and advantages of the invention will become apparent from the following detailed description taken with the drawings in which:

FIG. 10a Frame of the Smartdiskette with battery(s) 12, and plugs 18 as a current interface to the processor/memory card as well as a recess 19 where normally the drive for a magnetic disk is located;

FIG. 10b Cross-section of FIG. 10a with lateral guide rails;

FIG. 10c Processor/memory card with external dimensions of a chip card but 2 mm thick with processor 16, memory chip 17, and plugs 18 as data and current interface to the frame of the Smartdiskette as well as converter 13 and controller for magnetic interface 15;

FIG. 10d Cross-section of FIG. 10c with appropriate sides so that the processor/memory card can be inserted into the guide rails of the frame of the Smartdiskette;

FIG. 12 shows the invention used with a removable memory device, e.g., flash memory.

DETAILED DESCRIPTION OF THE PREFERRED EMBODIMENTS

The invention will now be described in more detail by example with reference to the embodiments shown in the Figures. It should be kept in mind that the following described embodiments are only presented by way of example and should not be construed as limiting the inventive concept to any particular physical configuration.

Figure 1:
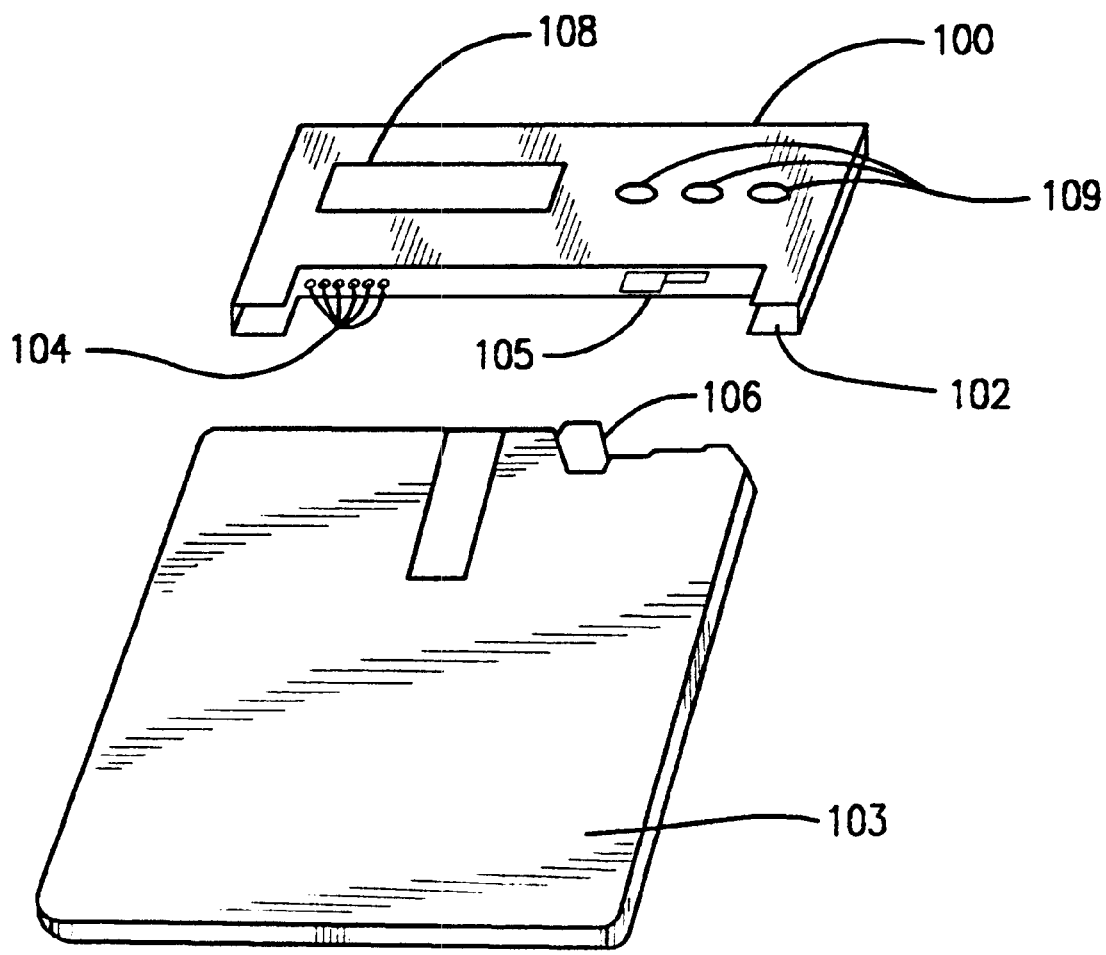
FIG. 1 shows a first embodiment of a PIU according to the invention, a "mini" PIU, having a slot for physical attachment to a smart diskette, electrical contacts to exchange data with the smart diskette, a mechanism to operate a switch on the smart diskette switch and a batter.

The "mini" PIU 100 according to a first embodiment of the invention, illustrated in FIG. 1, has, for example, a slot 102 for physical attachment to a smart diskette 103, electrical contacts 104 to exchange data with and/or provide power to the smart diskette 103, a mechanism 105 to operate a switch 106 on the smart diskette 103 switch, and an optional battery (not shown). The switch 106 powers the smart diskette 103 when it is inserted into a drive or PIU device. The slot 102 may include detents therein which fit into corresponding recesses in the smart diskette 103, for example, or other such conventional securing means, for removably securing the smart diskette 103 to the PIU 100.

The optional battery (not shown) could be accessed from the underside, i.e., the side opposite the display, through a conventional access panel, for example. The smart diskette 103 itself may contain an internal battery (not shown) as well.

Figure 5:
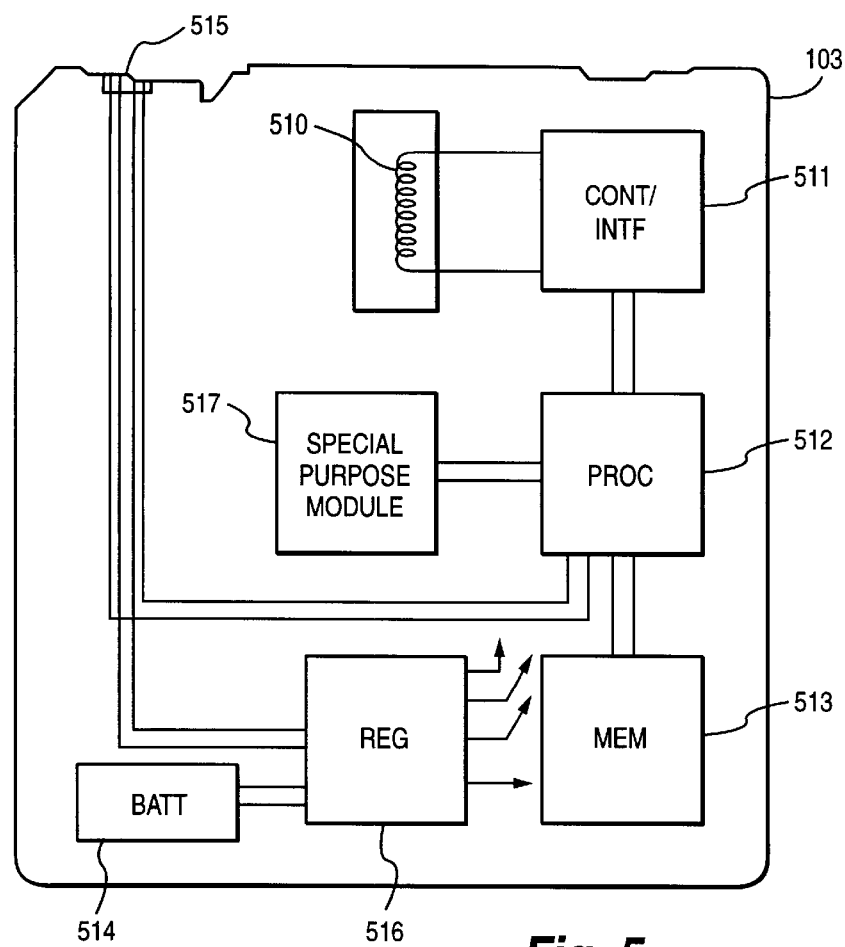
FIG. 5 shows an exemplary embodiment of a smart diskette.

Besides processor, memory and interface circuitry, the smart diskette 103 may also include a real-time clock, and special purpose modules, such as for implementing a cellular telephone, pager, heart-rate monitor, etc. Operating system firmware would be provided on the smart diskette 103, and application program instruction could either be provided in firmware, be down-loadable into RAM memory, or a combination of both. FIG. 5, which will be described below, shows an exemplary smart diskette in more detail.

With the illustrated optional display 108 and buttons 109 a user can read displayed text or graphical data transferred from the smart diskette 103 and, for example, enter selections from a menu presented on the display 108 by actuation of an associated button 109. One of the buttons 109 could advantageously be a manual override power switch to override the switch 106 and de-power the smart diskette 103.

The currently widespread liquid crystal display (LCD) technology provides an effective energy display for use with the PIU 100. Although not illustrated, the PIU display 108 would incorporate conventional circuitry for driving the display 108 based on data transferred from the smart diskette 103. Alternatively, such display driving circuitry could be incorporated into the display 108 itself, or provided on the smart diskette 103, if practical.

The buttons 109 can be configured as mechanical switches, for example, of various conventional types. Conventional circuitry for detecting/decoding the actuation of a button 109 could be provided on the PIU 100 or alternately the smart diskette 103, as with the display driving circuitry.

Optional further interfaces (not shown) to peripheral devices may be provided on the mini PIU 100, e.g., to a heart-rate monitor or cyclometer, as would be readily apparent to one skilled in the art. These further interfaces may be, for example, infra-red, wired, or wireless links.

For example, a heartbeat detector would transmit pulses of data corresponding to a user's heartbeat via a wireless link to the mini PIU 100 and hence into the smart diskette 103. The smart diskette 103 would store a continuous count of incoming heartbeats and use an on-board real-time clock (not shown) to calculate heart-rate at pre-progammed timing intervals. The user would subsequently insert the smart diskette 103 into a PC's standard 3½" floppy disk drive and run an application program on the PC which would display the recorded heart-rate data and, for example, show comparisons with previous measurements. Further, with the optional display 108 and buttons 109, a user can have an immediate/continuous read-out of his/her heart rate on the PIU 100.

Figure 2:
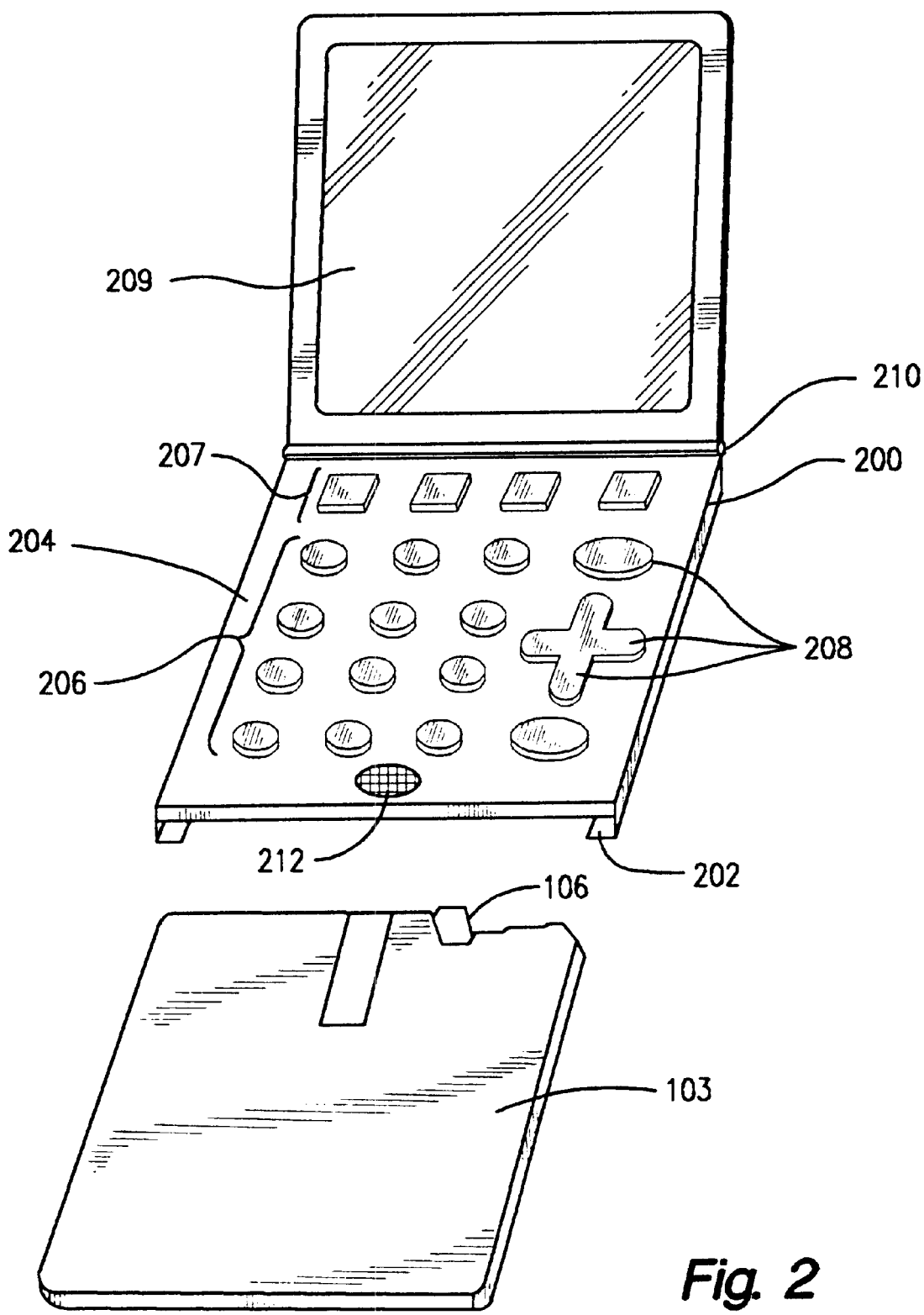
FIG. 2 shows a second embodiment of a PIU of approximate dimensions 3½"×3½"×5" with a slot for physical attachment to a smart diskette, electrical contacts and/or a magnetic transducer to exchange data with the smart diskette, a mechanism to operate a switch on the smart diskette and a battery.
Figure 6:
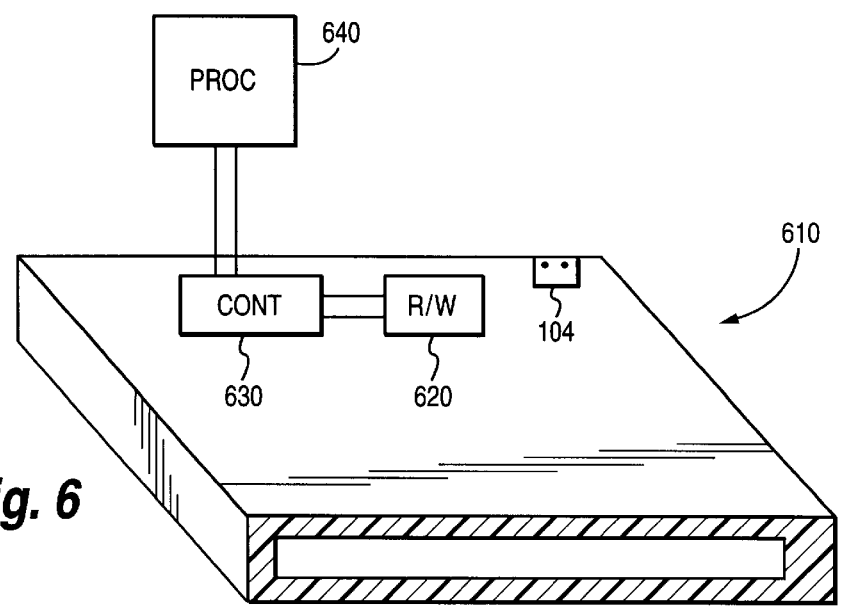
FIG. 6 shows a read/write device having no drive or head motors for use with a smart diskette.

A PIU 200 according to the second embodiment of the invention is illustrated in FIG. 2. The PIU 200 according to this exemplary embodiment would have the approximate dimensions of 3½"×3½"×0.5", for example, and includes slot 202 for physical attachment to a smart diskette 103. Either electrical contacts (104) as in the first embodiment (FIG. 1) and/or a magnetic transducer as in the read/write unit according to related copending application Ser. No. 08/211,488, is provided in the PIU 200 to exchange data with the smart diskette 103. Also provided on PIU 200, but not shown, is a mechanism to operate smart diskette switch 106, and an optional battery, as in the first embodiment of FIG. 1. An exemplary read/write unit is illustrated in FIG. 6, and will be described in more detail below.

Further the illustrated PIU 200 incorporates a keypad 204 provided with, for example, alpha-numerical 206, function 207, and cursor control 208 keys, a display 209, open/closeably connected to the PIU 200 by a hinge 210, for displaying data and/or graphics, with optional touch-screen functions provided through appropriate design and programming, and a piezo-electric beeper, for example (not shown). As with the first embodiment, conventional circuitry for driving the display, keyboard and beeper could be provided on the PIU 200, or alternatively, the smart diskette 103.

Further optional features envisioned could include a conventional transducer or transducers 212, and circuitry (not shown) to operate the PIU 200 as a cellular telephone and/or pager. As with the first embodiment 100, optional interfaces (not shown) to peripheral devices may be provided for on the PIU 200, as would be readily apparent to one skilled in the art.

The second embodiment PIU 200 could be used follows, for example. A user would insert a smart diskette 103 into a standard 3½" floppy diskette drive of a PC and download, for example, a diary program and data from a PC application into the memory of the smart diskette 103. The smart diskette 103 would then be removed from the PC and inserted into the PIU 200 according to the second embodiment, which may be carried around easily and transported anywhere in the user's coat or shirt pocket. The PIU 200 can then be used to display on display 209 the diary, and update it via the keypad 204 or touch-screen 209 no matter where the user is located, for example, on an airliner or train, or in a restroom. The optional real-time clock inside the smart diskette 103 can produce an audible signal through the PIU piezo-electric beeper (not shown) to warn the user of appointments, etc. thereby functioning as an alarm clock.

Figure 3:
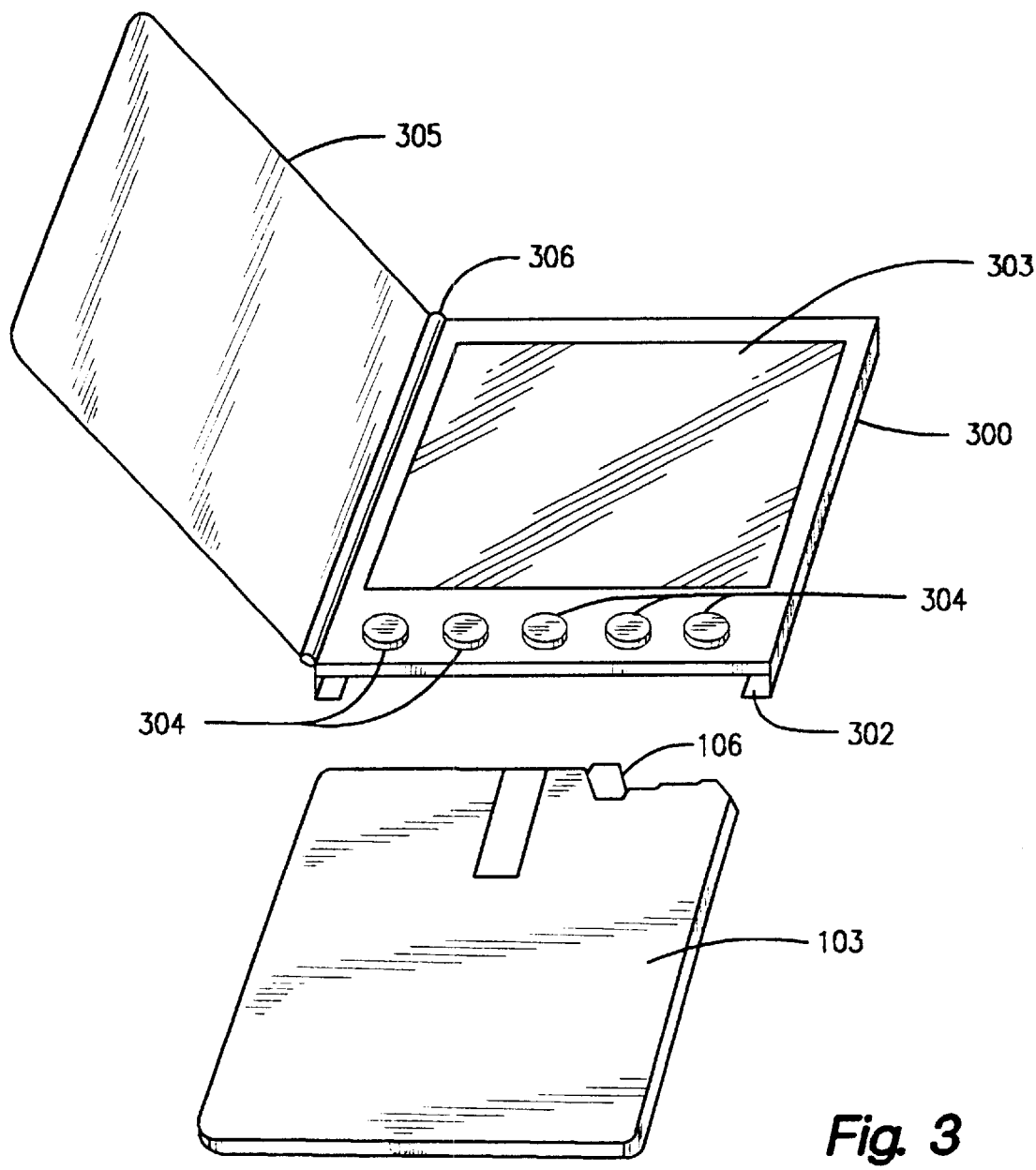
FIG. 3 shows another embodiment of a PIU having similar dimensions and features as the embodiment of FIG. 2, but having a touch-screen or write-on display plus a few buttons replacing the keypad as the means of user input.

The next exemplary embodiment illustrated in FIG. 3 is a PIU 300 with similar dimensions, i.e., sized to fit easily in a coat or shirt pocket, and features as the embodiment (200) of FIG. 2. The PIU 300 has a slot 302 for accommodating a smart diskette 103, a touch-screen or write-on display 303, and a few buttons 304, instead of the keypad 204 of the second embodiment (200) for user input. An open/closeable cover 305 to protect the display 303 is connected to the main body of the PIU 300 by hinge 306, for example.

Further options which could be included in the embodiment of FIG. 3 would be generally the same as for the embodiment (200) of FIG. 2, that is, conventional transducers and circuitry to operate as a cellular telephone and/or pager, optional interfaces to peripheral devices, etc., as would be readily apparent to one skilled in the art.

Figure 4:
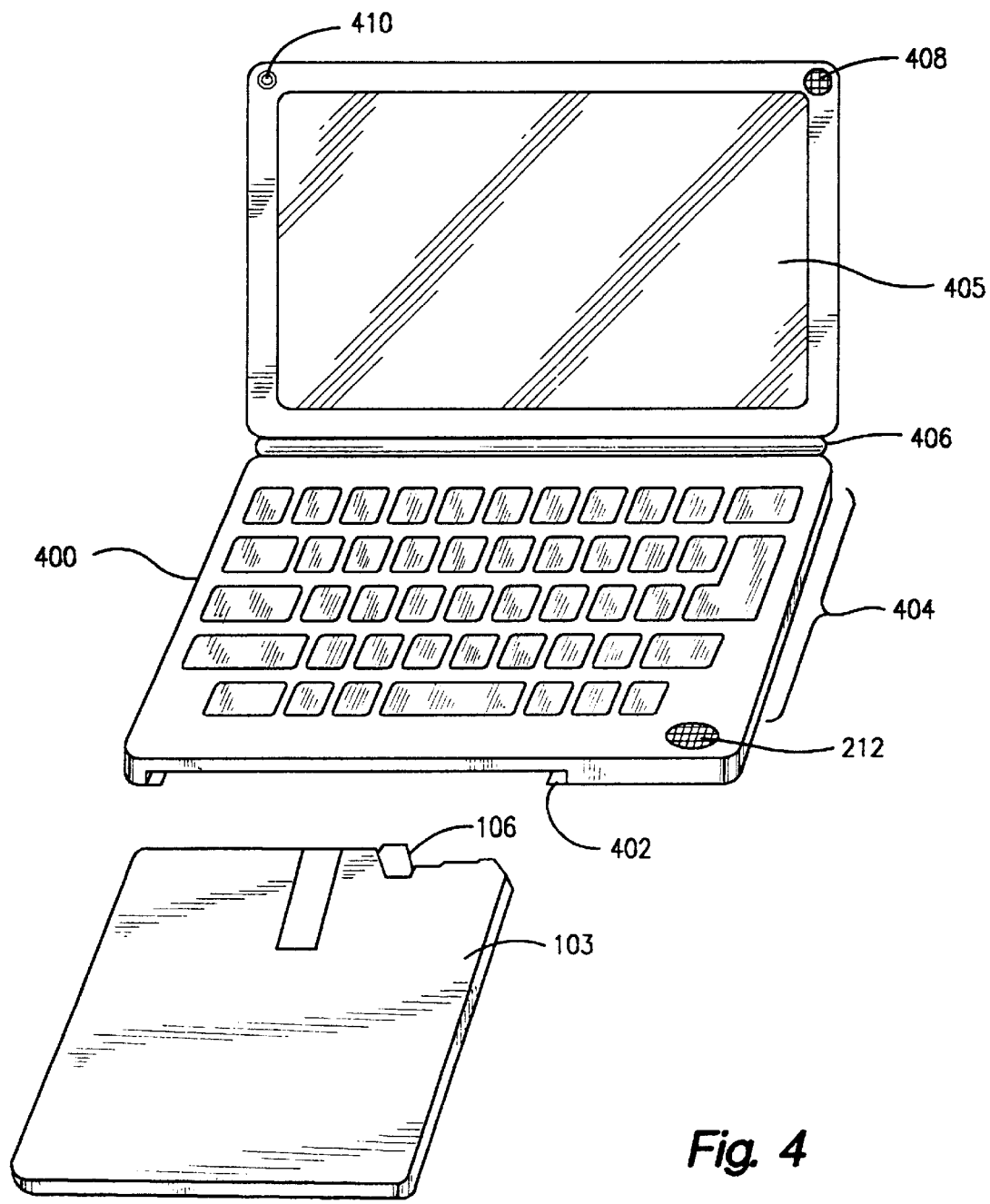
FIG. 4 shows another embodiment of a PIU having the approximate dimensions of 6"×5"×0.75" and having a slot for physical attachment to a smart diskette, electrical contacts to exchange data with the smart diskette, a mechanism to operate a smart diskette switch and a battery.

FIG. 4 shows another embodiment of a PIU 400 having, for example, the approximate dimensions of 6"×5"×0.75", with a slot 402 for physical attachment to a smart diskette 103, electrical contacts and/or a magnetic transducer (not shown) as in the previously described embodiments to exchange data with the smart diskette 103, a mechanism (not shown) to operate a smart diskette switch 106, and an optional battery.

This exemplary illustrated embodiment has a small-sized computer "qwerty" keyboard 404 and a relatively large display 405 open/closeably attached by hinge 406 to the PIU body. Also illustrated is an exemplary location of an optional microphone 408 and micro-camera 410. Associated conventional electronic circuitry (not illustrated) for these optional devices 408 and 410 would be located either in the PIU 406 or the smart diskette 103.

Further options for this exemplary embodiment include those mentioned above for the other embodiments, i.e., a conventional transducer or transducers (212), and circuitry to operate as a cellular telephone and/or pager, optional interfaces to peripheral devices, etc., as would be readily apparent to one skilled in the art.

FIG. 5 illustrates an exemplary smart diskette 103 for use with a PIU according to an embodiment of the present invention. A magnetic transducer 510 is electrically coupled to control/interface block 511 to accomplish data transfers to and from a corresponding read/write head in the PIU. The control/interface block 511 is further coupled to processor block 512. Memory block 513, which represent RAM, ROM, EEPROM, Flash memory, etc., is coupled to the processor block 513. Battery 514 supplies power via regulator 516 to the various components. Alternatively, power may be supplied through contacts 515 from the PIU, as previously described Also, data transfers may be accomplished through contacts 515 if the PIU does not provide a read/write head. Special purpose module block 517 represents the circuitry necessary to implement a special function, e.g., cellular telephone, pager, etc.

FIG. 6 illustrates an exemplary read/write unit 610, provided with contacts 104, a read/write head 620, and a control block 630 which is shown coupled to an external processor 640.

The illustrated embodiments are PIU's for use with a 3½" sized smart diskette, however, a PIU which adapts to other sized smart diskettes, e.g., 2", 2¼" or 5¼" sized smart diskettes, for example, are considered within the scope of the present invention.

Although the illustrated PIU embodiments accommodate a smart diskette in a slot engagement arrangement, other arrangements are also envisioned. Instead of a slot, the PIU could snap-fit onto a top surface of a smart diskette, for example.

Although the described PIU's optionally include a battery, other appropriate power sources may be provided instead of, or in conjunction therewith, for example, an array of solar cells could be provided on an upper surface of the PIU and/or smart diskette.

Although the smart diskette is described as having a microprocessor and program memory, this could be substituted in whole or in part with hard-wired logic circuitry, programmable logic arrays, or the like, as would be readily apparent to one skilled in the art.

The various transducers optionally provided are envisioned to include built-in microphones and speakers, and/or jacks for external microphones and speakers could be provided. Telephone and modem tone generators may be incorporated into the PIU's, as can be visible and infra-red light producing devices, and the like.

Various additional functionality could of course be provided by the smart diskette itself For example, the smart diskette itself could include additional interface circuitry for coupling to a communications network, as disclosed in U.S. Pat. No. 5,457,590 and related copending application Ser. No. 08/479,747 (Atty Docket No. LWBR 0013D1). The smart diskette could include circuitry for interfacing with any of a variety of peripheral devices, for example, a smart-card (IC) reader.

Figure 7A:
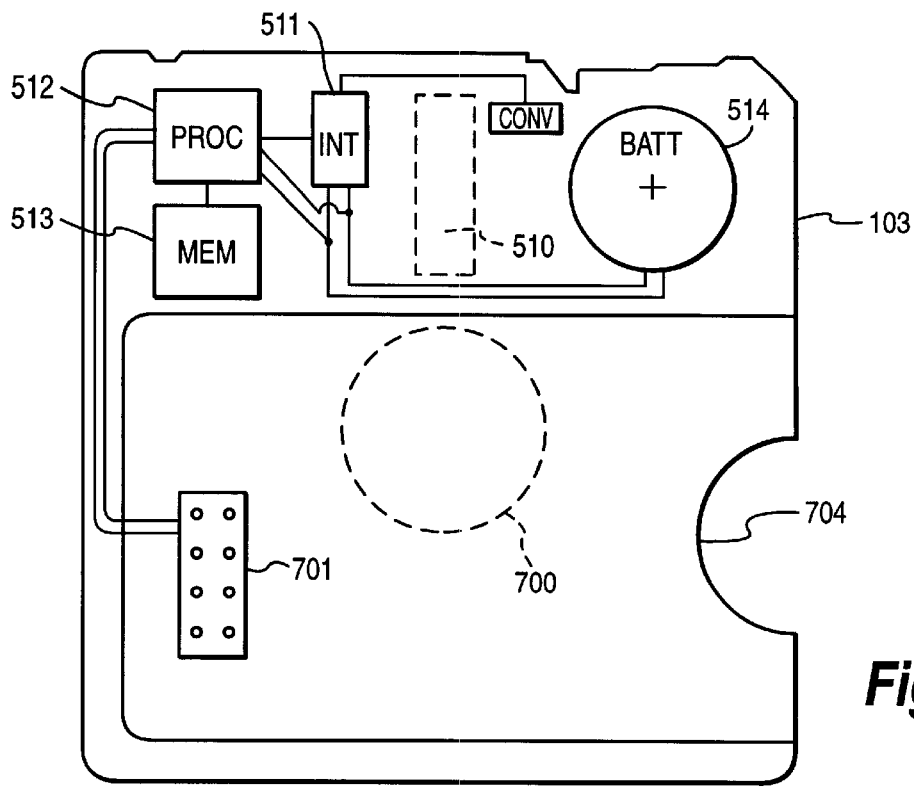
FIG. 7a shows a smart diskette adapted to receive an IC smart-card, with battery 514, converter (CONV), controller for magnetic interface 511, processor 512, memory chip 513 and a contact device 701 for chip card and recessed grip 704 for removing the chip card as well as a recess 700 where normally the drive for a magnetic disk is located.
Figure 7B:
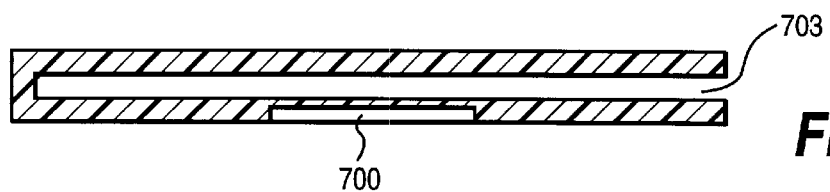
FIG. 7b shows a cross-section of the smart diskette of FIG. 7a, with a recess for inserting a chip card and a recess 700 where normally the drive for a magnetic disk is located.
Figure 7C:
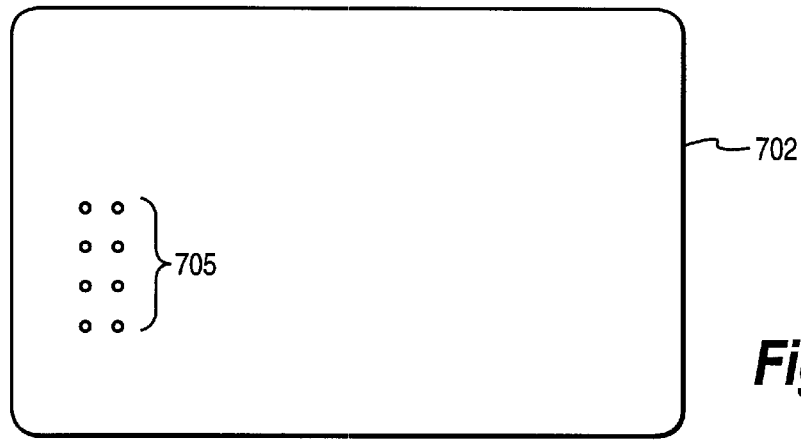
FIG. 7c shows an IC smart-card for insertion in the smart diskette of FIGS. 7a and 7b, a standard chip card with standard contacts, processor and memory chip.

Alternatively, a smart-card reader could be built into the smart diskette, such as illustrated in FIGS. 7a, 7b and 7c, and disclosed in related U.S. Pat. No. 5,584,043.

Shown in FIGS. 7a–c is one example of a smart diskette 103 adapted to include contacts 701 for interfacing with a smart-card 702 and to include a slot 703 having a cut-out 704 for facilitating grasping the card 702, so that the card 702 is insertable in slot 703 and contacts 701 connect with corresponding contacts 705 on the card 702. The illustrated arrangement of some of the components on the smart diskette has been changed to accomplish this, e.g., battery 514, magnetic interface 511, processor 512, and memory 513. Of course, the location and size of the card receiving slot 703 and the number of contacts 701 would vary depending on the IC smart-card 702 to be accommodated. Recess 700 is disposed on the bottom of the smart diskette 103 where the drive for a magnetic diskette is normally located.

The Smartdiskette 103 shown in FIGS. 7a and 7b contains a 2-millimeter recess, in which a chip card 702 can be plugged in from the side alongside a contact device 701 which supplies the chip card 702 with current from the battery 514 and establishes a data link from the processor of the chip card 702 to the processor 512 of the Smartdiskette 103. Further, the Smartdiskette 103 contains a recess 700 on the bottom. The drive for a magnetic disk is normally located here. There is a recessed grip 704 for pulling out the chip card 702 at the right-hand edge of the Smartdiskette 103. The chip card 702 shown in 7c is a standard 0.8 millimeter thick chip card with processor and data memory. It also has contacts for supplying current from battery 514 of the Smartdiskette 103 and for establishing a data link from the processor of the chip card to processor 512 of the Smartdiskette 103.

Figure 8A:
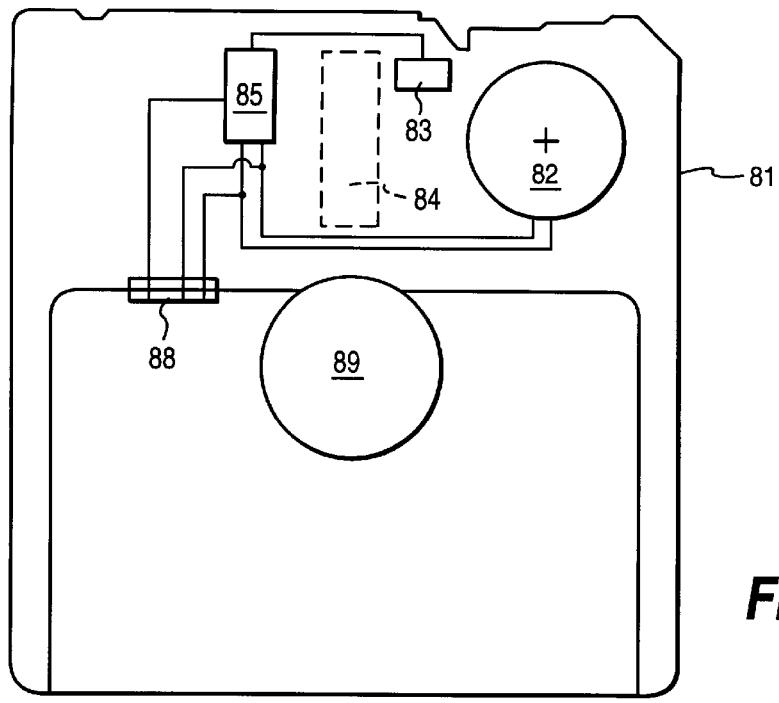
FIG. 8a A Smartdiskette with battery 82, converter 83, controller for magnetic interface 85 and plugs 88 as data and current interface for the processor/storage board (memory card) as well as a recess 89 normally reserved for the drive for a magnetic disk.
Figure 8B:
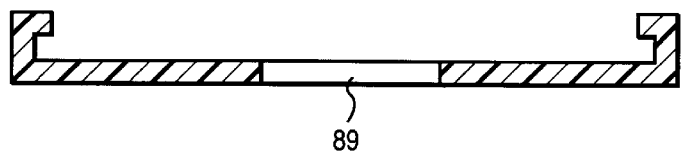
FIG. 8b Cross-section of FIG. 8a with lateral guide rails and a recess 89 normally reserved for a magnetic disk.
Figure 8C:
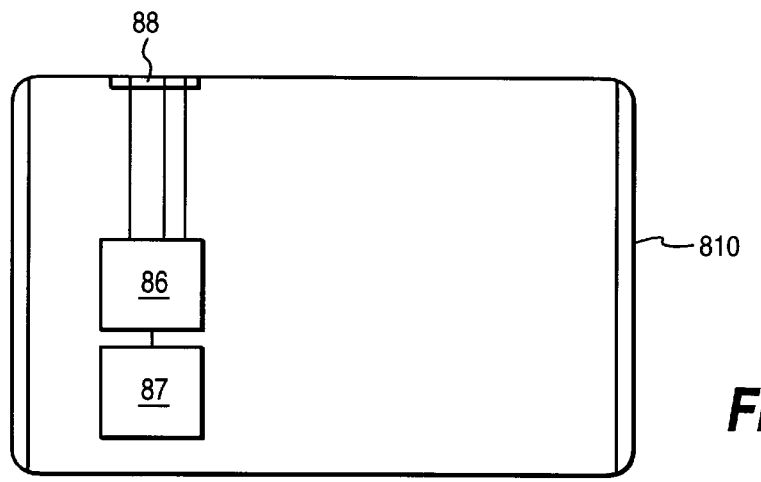
FIG. 8c Processor/memory card with external dimensions of a chip card but 2 mm thick with processor 86, memory chip 87, and plugs 88 as data and current interface to the frame of the Smartdiskette.
Figure 8D:
FIG. 8d Cross-section of FIG. 8c.

The Smartdiskette depicted in FIGS. 8a and 8b contains a recess of 2 millimeters to accommodate a processor/memory card 810 as well as plugs 88 in order to supply the processor/memory card 810 with current from the battery 82 and to produce a data link from the processor 86 of the board 810 to the magnetic interface 85 of the Smartdiskette 81. Furthermore, the Smartdiskette 81 contains a recess 89 on the bottom side where normally the drive for a magnetic disk is located. The 2 millimeter thick processor/memory card depicted in FIGS. 8c and 8d contains in addition to the processor 86, a data memory 87 as well as plugs 88, in order to supply the Smartdiskette with current from battery 82 and to produce a data link from the processor 86 to the magnetic interface 85 of the Smartdiskette 81. Alongside the processor 86, the 2 millimeter thick processor/memory card contains a data memory 87 and plugs 88 for the current supply from the battery 82 of the Smartdiskette and for establishing a data link from processor 86 to the magnetic interface 85 of the Smartdiskette 81. The wide sides are tapered to 1 millimeter so that the card 810 can be plugged into the recess of the Smartdiskette 81.

Figure 9A:
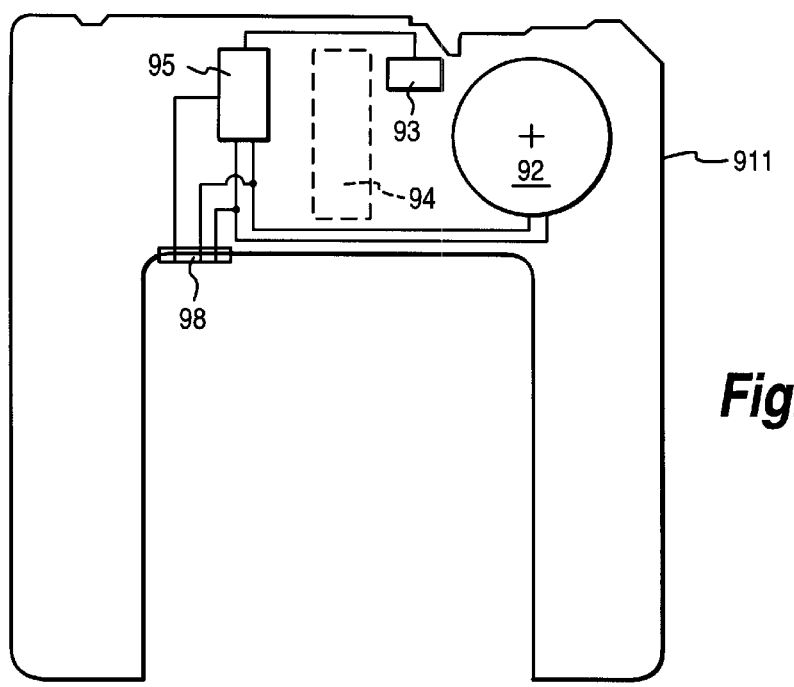
FIG. 9a Frame of the Smartdiskette with battery 92, converter 93, controller for magnetic interface 95 and plugs 98 as data and current interface for the processor/memory card.
Figure 9B:
FIG. 9b Cross-section of FIG. 9a with lateral guide rails.
Figure 9C:
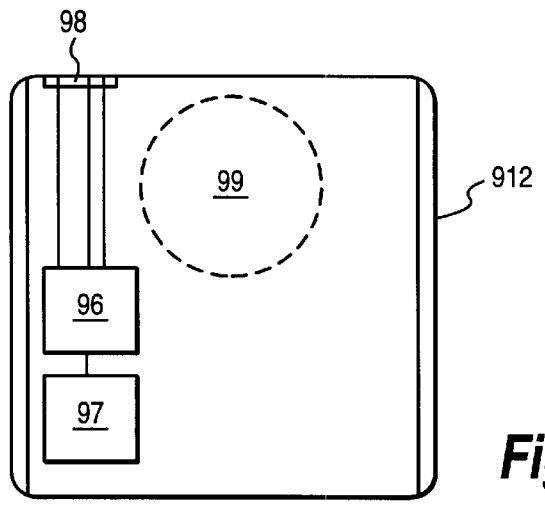
FIG. 9c processor/memory card with external dimensions 60 mm ×55 mm×3 mm with processor 96, memory card 97 and plugs 98 as data and current interface to the frame of the Smartdiskette as well as a recess 99 where normally the drive for a magnetic disk is located.
Figure 9D:
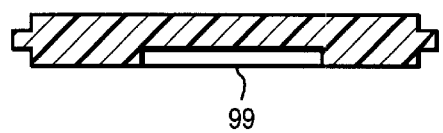
FIG. 9d Cross-section of FIG. 9c with appropriate side so that the processor/memory card can be inserted into the guide rails of the frame of the Smartdiskette as well as a recess 99 where normally the drive for a magnetic disk is located.

The Smartdiskette 911 shown in FIGS. 9a and 9b has a cutout with a 1 millimeter wide groove to accommodate a 3 millimeter wide processor/memory card 912 alongside plugs 98 for supplying the processor/memory card 912 with current from the battery 92 and establishing a data link from processor 96 of card 912 to the magnetic interface 95 of the Smartdiskette 911. Alongside the processor 96, the 3 millimeter thick processor/memory card shown in FIGS. 9c and 9d contains data memory 97 and plugs 98 for the current supply from the battery 92 of the Smartdiskette and for establishing a data link from processor 96 to the magnetic interface 95 of the Smartdiskette 911. The long sides contain a 1 millimeter thick spring which enables card 912 to be plugged into the cutout and the groove of the Smartdiskette 911. Further, card 92 contains a recess 99 on the bottom. The drive for a magnetic disk is normally located here.

The Smartdiskette 113 shown in FIGS. 10a and 10b contains a 2 millimeter recess for the accommodation of a process/memory card with integrated magnetic interface 14 alongside plugs 18 for supplying card 114 with current from the battery 12. Further, Smartdiskette 113 contains a recess 19 on the bottom. The drive for a magnetic disk is normally located here. Alongside the processor 16, the2 millimeter thick processor/memory card shown in FIGS. 10c and 10d contains a data memory 17, converter 13 and controller for magnetic interface 15, alongside plugs 18 for the current supply from the battery 12 of the Smartdiskette. The long sides are tapered to a width of 1 millimeter so that card 114 can be plugged into the recess of the Smartdiskette 113.

Figures 11A, 11B:
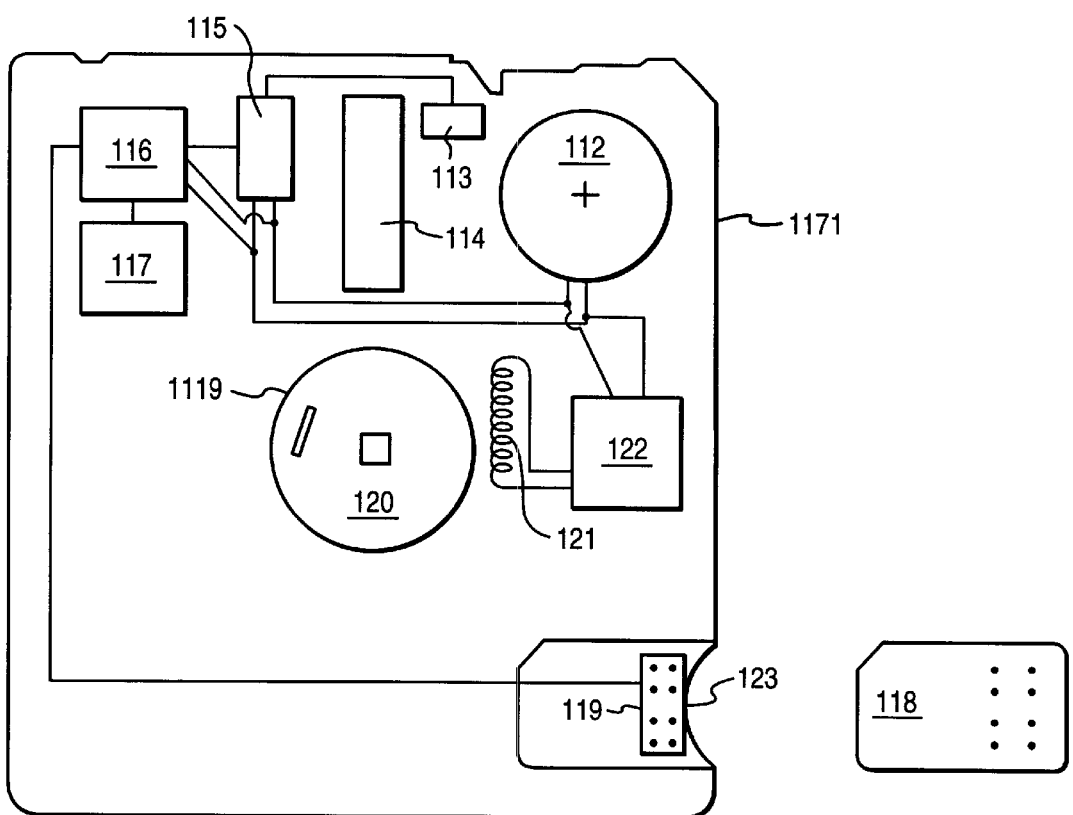
FIG. 11a A Smartdiskette with battery 112, converter 113, controller for magnetic interface 115, current generator consisting of rotor 120, stator 121, current regulator 122, contact device 119 for mini-chip card 118 as well as recessed grip 123 for removing the mini-chipcard.
FIG. 11b A mini-chip card with processor and data memory.

The Smartdiskette 1171 shown in FIG. 11a contains a 1 millimeter recess, in which a chip card 118 can be plugged in from the side, and a contact device 119 for supplying the chip card 118 with current from battery 112 and for establishing a data link from the processor of the chip card 118 to the processor 116 of the Smartdiskette 1171. Further the Smartdiskette 1171 contains recess 1119 on the bottom. The drive for a magnetic disk is normally located here. There is a recessed grip 123 for pulling out the mini-chip card 1 18 at the right-hand edge of the Smartdiskette 1171. The chip card shown in FIG. 11b is a standard 0.8 millimeter thick mini-chip card with processor and a data memory. It also has contacts for supplying current from battery 112 of the Smartdiskette 1171 and for establishing a data link from the processor of the mini-chip card to processor 116 of the Smartdiskette 1171. In this embodiment, the Smartdiskette includes battery 112 connected to a current generator comprised of rotor 120, stator 121, and a current regulator 122.

A Smartdiskette, as described in this invention, with plug-in processor/memory card and all its associated advantages offers a wide range of possible applications, as can be seen from the following list:

Application Possibilities

Read/write device for chip cards and mini-chip cards.

Communication of a chip card and mini-chip card with a PC (personal computer).

Memory card with several megabytes storage capacity.

Memory card with integrated processor for checking an access code. The memory is enable only if the access code is recognized as being correct.

A portable safe data carder, which can be carried comfortably in a purse or wallet, and which can communicate with any standard PC when it is plugged into the Smartdiskette.

Advantages Can be used in conjunction with any PC or workstation with 3½" drive.

Can be used with laptops and notebooks.

Is independent of the PC operating system capacity.

Is independent of the available interfaces and plug-in locations of the PC.

No normalization problems. Normlized interfaces are already available.

There are no hardware installation costs.

Higher data rate (up to 500 kbit/sec).

Space-saving and portable.

High storage capacity (several megabytes).

Security Features

Besides the general security features described above, a wide variety of security related features may be provided by appropriate programing and/or configuring of the smart diskette and/or PIU. For example, a PIU could be provided with a ROM containing a security code which would render it useless with a smart diskette which does not have a corresponding code. Alternatively, the smart diskette could prompt a user for an identification code upon insertion into a PIU, and deny access unless the correct code is entered on the PIU keyboard/keypad.

Besides those applications described above, it is envisioned that the PIU with inserted smart diskette could function to provide an electronic spread-sheet, a perpetual calendar, a telephone directory, a word-processor, entertainment (game) programs, English-foreign language dictionary, financial calculator, stock quote and/or analysis, or any other of the multitude of applications currently available for desk-top and notebook computers.

Other sorts of devices could be built into the PIU, for example, a scanner for scanning written documents into memory, or a micro camera (410 in FIG. 4) for providing video image storage and/or transmission over cellular telephone, for example. If disguised as or incorporated into an innocuous household or office item, such as a book or lamp, a PIU equipped with an audio or video input device could be used to provide secret monitoring of an area A smart diskette could be programmed to periodically record in its memory, for example, once a minute, a snapshot of audio or video input from such a PIU. Subsequently, the smart diskette would be removed and the snapshots retrieved into a personal computer by security personnel for analysis.

A PIU with a bar code reader could be used in inventory applications. For example, inventory bar codes would be scanned and/or keyed in, and stored in the memory on the smart diskette. Subsequently, the smart diskette could be removed from the PIU and inserted in an inventory control computer's 3½" disk drive for retrieval and processing.

A PIU equipped with a microphone (408 in FIG. 4) could be used as a dictation device where spoken text is digitized and stored in the smart diskette, or in various applications utilizing speech recognition technology. In the latter case, smart diskette 103 would be provided with word/phrase recognition software in memory 513, for example, and/or special purpose module 517 could be a vocoder analyzer, e.g., a programmed digital signal processor for implementing liner predictive coding (LPC). The PIU with smart diskette so configured then could function as a voice response system, i.e., programmed to respond to simple voice commands such as "save" or "run."

Alternately, the PIU with smart diskette configured with microphone 408 and speech recognition software/module could function as a speaker recognition system, i.e., a system which recognizes and/or verifies a particular person (speaker) producing the speech. The verification could be used to obtain access to the PIU functionality.

On the other hand, a PIU equipped with a keypad, display and loud-speaker, for example as in FIG. 2 or 4, could be used as an aid for speech-impaired individuals, where words and/or phrase codes could be keyed in, and spoken text accessed on the smart diskette and output through the loud-speaker. Conventional text to speech circuitry could be provided on the smart diskette in the special purpose module 517, and/or software in memory 513, for such an application.

The PIU keypad could further incorporate a Braille keyboard for use by sight-impaired individuals. Foreign language keyboards could be enabled through software and/or be provided as specific PIU's.

Specific medical information about an individual could be stored on a smart diskette, and medical personnel could access the information in an emergency either through a PIU or a hospital computer's 3½" disk drive. Such a smart diskette could be labeled with the international red cross symbol, or the like, identifing it as containing vital medical information. Such information could be stored in the smart diskette in any or all of the major languages for use when traveling abroad. Emergency contacts, such as family or medical specialists to contact in case of an emergency could be stored therein as well.

In a PIU equipped with a cellular telephone module, a panic button or emergency code could be provided on the PIU which would direct the smart diskette with PIU to automatically call emergency personnel. If also equipped with a heart rate monitor, in case of irregular heart beats, or other abnormal heart activity indicative of a medical emergency, the smart diskette could be programmed to call emergency personnel automatically.

The smart diskette could be loaded with bank transaction software and/or a specially configured PIU provided so that banking activities could be readily accomplished remotely. In such an application, security features such as are used conventionally in remote banking would be naturally provided.

A PIU with appropriately programmed smart diskette, could be used as an electronic answer sheet. For example, instead of providing test-takers with pencils and paper answer sheets, each test taker would be given an appropriately programmed smart diskette and PIU. The PIU would be provided with a display and numeric or alpha-numeric keypad. The smart diskette would be programmed to prompt the test taker for his/her unique identification number, such as a social security number or student ID number.

After entering and verifying the ID as being associated with a bonafide student, the smart diskette would prompt the test-taker to open the test booklet and begin the test. The smart diskette with PIU would then display something like "Q1?" and wait for the test-taker to input the number corresponding to his/her answer selection for the first question. When the first answer is entered, the smart diskette would record the answer in its memory and display a prompt for the next question. A built in timer could be provided which would end the test after a pre-programmed time had elapsed.

After the test had been completed, the test-takers would turn-in their smart diskettes and PIU's. To grade the test, the test-giver would simply remove each smart diskette from its PIU, and insert each smart diskette into the 3½" disk drive of a personal computer programmed to access the test-taker's ID and answers, and determine a raw score.

After loading all the test-takers' data, the personal computer could readily identify questions which should be discarded or discounted because all test takers missed them, for example. The personal computer could calculate mean and median scores, assign grades, etc. With such a device, grading errors due to stray or light pencil marks, for example, associated with paper answer sheets would be eliminated. Additionally, special purpose and expensive test reading devices would be eliminated since the ubiquitous personal computer programmed to access the smart diskettes through its 3½" disk drive would be used.

From the above examples it should be apparent that the variety of uses for the present invention are limited only by the imagination of the application programmer. As memory with greater and greater capacity becomes available, the data and program storage capacity of the smart diskette expands accordingly. Likewise, as microprocessors with greater capabilities are developed, so to the capabilities of the smart diskette expand.

As display technology advances, so too does the display capability of the PIU display. The present display technology, e.g., liquid crystal display (LCD), is sure to advance to more efficient and effective displays in response to consumer demand, and the present invention contemplates incorporation of new display technologies as they arise for the PIU display. Likewise, as keyboard standards change, the PIU's can be configured to incorporate such new keyboards.

FIG. 12 shows yet another exemplary embodiment of the invention, in particular where the user removable memory device 1202 comprises only memory, e.g., flash memory, and connectors, i.e., there is no significant processor power on the card 1202. The removable memory device 1202 is the type that is typically used in digital cameras, for example. The insertable frame is designed to fit into a personal computer (PC) disk drive, e.g., a 3½" diskette drive, and interface therewith through the transducer, as illustrated. The transducer is coupled to an interface circuit coupled to an ASIC cirucit, and is under the control of a processor, e.g., a 6805 processor, or the like. Power is supplied via one or more batteries and a DC-DC converter. As one skilled in the art would recognize, the exemplary embodiment illustrated could be subject to many variations, all of which are considered to be within the scope of the invention. Data can be read from or written to the memory of the removable memory device with the illustrated embodiment Digital signals from the memory device can be converted to an analog signal, e.g., MFM, and a standard floppy drive can be used to transfer the information to a PC. Pictures taken with a digital camera and stored on a removable memory device could thus be transferred to a personal computer for editing and the like. Firmware on this embodiment coordinates with its ASIC to read the digital information from a removable memory device and convert it to the MFM signal to be transferred to the PC through the floppy drive.

The picture data so transferred in this embodiment may appear to the computer user as standard a JPEG picture format file, for example, on a standard floppy diskette. The user can access the pictures on the removable memory device using the standard disk operations of the operating system of the PC. The user can, for example, read or write to the memory, get a directory of the pictures on the memory device, copy, delete, and view with a standard PC picture viewer, etc., just as if using a standard floppy diskette. Insertable memory devices may store on the order of 2 to 16 megabytes or more. Besides pictures, audio and multimedia data could be transferred to a PC using this embodiment, for example. The memory module could be used to provide a hard disk backup, or to transfer data from one PC to another, as would be apparent to one skilled in the art.

Set forth below is a description of an implementation of this embodiment, including various software modules. One skilled in the art could make and use the invention without undue experimentation absent the description below, or could implement the invention in another operational manner. Therefore, the description set forth below of exemplary software modules is not intended to limit the invention in any way, to any particular implementation, but merely to give an example of how the invention could be implemented The description below may be most meaningful to those skilled in the art of programming microprocessors, in particular, the 6805. The embodiment of the insertable element with a removable flash-memory device installed is called "FlashDisk" or "FlashPath" below, the assignee retaining all proprietary rights in the names and software modules set forth herein.

1. 6805 Software Modules

The 6805 allows only 8 significant character variable and function names. We can follow the conventions used in SDOS code for FlashDisk code (replacing the 'S' for SDOS with 'F' for FlashDisk).

All functions start with 'F'

Service handler functions start with 'Fh'

All variables start with 'Fv'

Constants start with 'F' and are all upper case

Functions and variable names are of upper and lower case using upper case to indicate the start of each word (or abbreviated word) within the name—i.e. not using underscores.

1.1 Initialization Code 1.1.1 Microcontroller Initialization (FBoot)

This needs to setup the microcontroller hardware:

Setup the option register to give as much RAM as possible.

Clear RAM.

Setup interrupts

Setup output register initial values:

PB0—TX/~RX=0

PB3—DMA enable =0

PB4—Data from bus/buffer=0

PB5—CLK SEL=1 (high speed).

PC5—~WE=1

PC6—~RE=1

PC7—OFF =0

Wait for PD2 (D/~P) before setting I/O direction registers. (PA, PB, PC all outputs).

1.1.2 FlashDisk Initialization (FInit)

Set the Flash ship enables to be all off.

Clear the CPU RAM.

Determine the number of Flash chips that are installed by reading the device ID code.

Store this number in the variable FvMaxChip.

Use the number of Flash chip to set the 3 byte Flash address (FvERPAdr) of the ERP (Emergency Remap Pages). This will be the last Flash block of the last chip.

Set FvMaxSee to the maximniu sector number that the FlashDisk can have i.e. the sector number corrspnding to the block imediately below the two ERP blocks in the last Flash device.

1.1.3 Startup Code (FStart)

Set the initial status message in the response buffer.

Set FvIdle to the number of times the idle loop will be repeated before going into the sleep state.

Set FvSate to FIDLE

Set the input error count (FvInErC) to the maximum number of bad inputs that can be received before the threshold is switched.

Load the ERP block tail and check to see if the remap block has been used (first FP byte set to zero) or the block is uninitialised (FP is FFh). If either of these cases then set the remap block used bit in FvWrStat to disable writing.

Start the transmission of padding characters by calling FOutInit and then jump to the idle loop which outputs the status message, boot sector and drive A: simulation sectors.

1.2 Low Level Magnetic Comms Software

The low level magnetic comms software is implemented as a state machine comprising three output track control loops and two input data functions. Each control loop corresponds to a state of the state machine.

1.2.1 Protocol Buffers

Since the 6805 has very limited RAM the request and response buffers share the same 102 bytes of memory. This means that a request from the PC will overwrite the previous response.

The request and response buffers have the same format. The service data bytes (d0 to d52) are contained within the protocol data bytes (p0 to p53) as follows:

| | |
|---|---|
| p0 | = FDh = FlashDisk Message ID (or DFh on outgoing messages after a threshold switch) |
| p1 | = Message sequence number (incremented by the FlashDisk); |
| p2 | = Sector number which the PC can currently write to |
| p3 | = d0  Service number (request)/result code (response) |
| p4 to p52 | = d1–d48 Service Data |
| p53 to p54 | = CRC over p0 to p52 inclusive |

1.2.2 Input Functions

FInFlash—Read data fom PC into the RAM device
Setup PA0–7 as inputs;
Set the 6805 timer to count down FINPTIME microsecs—the input data start timeout value;
Wait for input data by polling for a transition on PD4 (RX data available—it will be clear when TX/~RX is first cleared before receiving the first byte) whilst checking that the timeout has not occurred.
Reset the timer to timeout after about 520 bytes.
For each of the 512 bytes of data. that come in add them to the checksum byte FvChk. This is a global checksum over the whole data transaction (max 16 sectors) which is reset and checked by the service routines.
Data will be written to the RAM from the MFM decoder.
Reset the DMA controller when timed out or all data received.
If all 514 bytes were received then reset FvIdle and exit with SUCCESS in the reg.
Otherwise return an error code in the a reg.
FInCPU—Read data from the PC into the CPU RAM
Setup PA0–7 as inputs;
Set the 6805 timer to count down FINPTIME microsecs—the input data start timeout value;
Wait for input data by polling for a transition on PD5 (input detect) whilst checking that the timeout has not occurred.
When input data is available, check the first byte for the FlashDisk magic number (FDh). If its not present then ignore the input.
Read 52 bytes of data from the MFM decoder into the CPU RAM checking for a timeout for each byte.
After the 52 bytes of data comes the two CRC bytes, which must be checked with the data that was received.
Start timeout, intercharacter timeout and bad CRC over the received data will all cause an error to be returned to the calling control loop and the count of invalid inputs (FvInErC) to be decremented. When this reaches zero the theeshold is switched by setting PB2 and changing the message ID byte in the protocol buffer to DFh.
For valid data reset the input error count (FvInErC).
Reset the DMA controller by toggling TX/RX (PB0).

1.2.3 Output Functions:

FOutInit
Kicks off the output data with padding characters—we can output as many of these as we like:
Set PA0–7 as outputs.
should be taken from the data bus and set to
Write the first byte of the output data (4e) to PA0–7
Set PB4 (ENCSRC) to indicate that the next byte should be taken from the data and set to transmit (set PB0).
Wait for the byte to be taken by polling TX/RQ(PD4) until it goes high then low then clear PB4 (ENCSRC).
Set timer to wait for at least 50 bytes to be sent.
FIdleWr
Reset the idle count (FvIdle).
Clear the power save mode bit (PB5) which slows the CPU clock down to 100K. Wait for 200 ms before setting the power save bit.
Call FoutInit to restart transmission of the padding and then jump to the idle loop.

1.2.4 Header Transmission Functions:

These functions trnmit the various headers for a floppy disk track. They use instruction timed code to send the bytes to the MFfM encoder at the correct time. With ENCSRC set the MFM encoder gets bytes from the CPU data bus at 16 us intervals. Within the 16 us there is an 8 us windows (the 'safe period') when it is safe to change the state of the data bus i.e. the previous byte has been taken by the encoder.
Track header—FTxTrack
Wait for the timer to expire indicating that 50 bytes of padding has been sent (initially set by FoutInit).
Resynch with the encoder by waiting for TXRQ(PD4) to go high then low.
Set ENCSRC (PB4) to indicate the encoder should take bytes from the data bus.
Send the 12 bytes of 0's.
Set ENCVIOL (PB1) to tell the encoder that the next bytes (3×c2) should have clock violations inserted.
Clear ENCVIOL and send the fc byte.
Sector header—FTxSecHd
On entry the x reg contains an offset into a table in ROM of sector header data.
Transmit 50 4e's then 12 0's
Set ENCVIOL (PB1) and send the three clock violation bytes (fe).
Clear ENCVIOL and send the sector specific header from ROM.
Send 22 4e's.
Data header—FTxDataHd
Send 12 0's, then three a1's with clock violations and finally an fb.

1.2.5 Control Loops:

These output the MNM tracks shown in diagrams 1 and 2. All the loops have to use instruction timed code.
FOutIdle
Setup PA0–7 outputs.
Call FTxTrack to transmit the padding characters and the track header. This function will resynchronise with the encoder by wait for TXRQ (PD4) to go high then low again.
*Call FtxSecHd with x register pointing to the sector header for sector 1, then call FTxDataHd to transmit the data header and finally call the FTxBootR function to transmit the boot record data. Repeat this for the other sectors (see diagram 1).
After transmitting the data sectors, transmit the input sector header by calling FTxSecHd. Input data is expected so clear TX/~RX (PB0) and call FInCPU to test for input data.
If input data is received then jump to FService to interpret input command otherwise continue outputting the track as follows.
Call FOutInit to transmit the padding and then call FTxTrack to transmit the track header. Call FTxSecHd to transmit the status sector header, then call FTxData Hd and finally FTxBufrf to transmit the response buffer.
After outputting this track a number of times without receiving a message from the PC (FvIdle has reached zero) then jump to FIdleWr. Otherwise go back to *.

FOutRead

Set the sector header pointer (FvSecHPtr) to point to the x+1 sector header in rom Reset the retry count, FvRetryCnt.

Reset the output sector count FvNumSecs to zero.

Output the status track by calling FtxTrack, FTxSecHd, FTxDataHd and FTxBuff.

Call FTxSecHd and FTxDataHd to send the headers for the current output sector in FvSecHPtr.

Set Port A to input.

Start the DMA trnfer the sector from RAM to encoder by pulsing DMAEN(PB3).

Wait for the DMA to finish by polling RDYBUSY (PD7).

Set Port A to output and write the padding character (4e) and wait for at least 50 to go.

Move the sector header pointer FvSecHPtr to the next output sector and increment the count FvNumSecs) of number of sectors sent.

Call FNextRd to set up the next sector in RAM.

Resynch with the encoder by writing for TXRQ (PD4), to go high then low.

Repeat from O until all the sectors have been sent (compare FvNumSecs with FvRdSecs).

Input data is expected, so call FTxSecHd to send the input sector header, clear RX/~RX (PB0), reset the count FvNumSecs and call FInCPU to test for input data.

If input data is received then reset the idle count (Fvldle) and jump to FService to interpret the input command otherwise call FOutInit to start retransmission and retransmit the track.

After outputting this track a number of times without receiving a request from the PC, jump to FIdleWr.

FOutWrite

Set up a count (FvRetryCnt) of the number of times round the loop before returning to the idle state.

Set Port A for writing.

Call FTxTrack to output the track header.

Output the current sector header in FvWrSHd (initialised by the service routine and increment by FNextWr).

Set to TX/RX (PB0) to receive.

Call FInFlash to get the data from the PC into RAM.

If data was received then jump to FNextWr to update the RAM and Flash necessary.

Otherwise, call FOutInit to restart trnmssion and then transmit the track header and status sector.

If the retry has not been exceeded the goto O. Otherwise jump to FIdleWr.

1.3 CRC or Checksun Checking

FChkSet will reset the checksum bytes FvCRC1 and FvCRC2.

FCRCByte will add the byte in a reg to the current running CRC held in FvCRC1 & FvCRC2.

FCRCBuf will calculate the CRC over the protocol response buffer as quickly as possible storing the result in bytes p52 and p53.

CRC checking is performed on the protocol buffer as it arrives by calling FCRCBuff. Due to time constraints it is not possible to check the data CRC for a whole sector sent by the PC. Instead a single byte checksum is sent with each written request. This checksum is a simple addition over the whole of the data (upto 16 sectors). The addition is carried out while the data is transferred to the RAM by the MFM decoder (in FInFlash). The checksum initialisation and checking is carried out by the write service (FhWrite) and the FNextWr function respectively.

1.4 Service Handler 1.4.1 Service Entry (FService)

Is called from the Idle output loop when a service request message comes in. Uses a lookup table to associate the service request codes in the request/response buffer with the appropriate service handler functions. Jump to the function (if found) or jump to an error handler function (FhError) if not found.

The Services are:

| Test | FhTest |
|---|---|
| Read sectors | FhRead |
| Read absolute block + tail | FhAbsRd |
| Read tails | FhRdTl |
| Write sectors | FhWrite |
| Write absolute block + tail | FhAbsWrt |
| Write tail | FhWrtT1 |
| Erase all Flashh | FhErasAll |
| Install new remap block | FhNewRBlk |
| Initialise FlashDisk | FhInitFl |
| FlashDisk information | FhInfo |
| Reads the temperature | FhTemp |

1.4.2 Service Exit (FServExit)

Each service will jump to FServExit with return a response in the response buffer, a response lenght in FvResLen and a service result in the CPU 'a' reg.

Each service will also set FvState to indicate which state to go into -FIDLE, FREAD or FWRITE.

FvWrSec will always contain the (floppy disk) sector number which the PC can write to, FvWrSHdr will always point to the sector header data for this sector number in ROM.

FServExit will:

Set the protocol response buffer offset 0 to the flashDisk message magic number;

Increment the response sequence number (which came from the PC in the request) (protocol response buffer offset 1);

Write FvWrSec to the protocol response buffer offset 2

Write the service result (in the 'a' reg) to response buffer offset 0;

Clear the rest of the response buffer (after the number of bytes in the response as indicated by the service handler).

Call FCRCBuf to calculate the CRC over the response buffer.

Jump to the appropriate control loop as indicated by FvState.

1.5 Services 1.5.1 Read Services Overview

In general the read services will set up an array of flash page addresses to read from. The FvFPPtr variable will point to the current flash page number in CPUm RAM and will be incremented by the FNextRd function every time it is called. This means that the read data output loop simply has to know how many sectors are to be output FvRdSecs) and to call FNextRd during the padding characters of the sector header preceding the data The read services should all therefore set offset 1 of the response buffer to the number of sectors to be read from Flash and FvFPPtr to point to the first page number in the page list FvState should be set to FREAD so that once FService will pass control on to the read data output loop once it has completed the information in the status response message.

1.5.2 Read Sectors (FhRead)

Request:
0 FSREAD (1)
1,2,3 Sector number
4 Number of sectors to read 1 to 16

Response:
0 Result (SUCCESS).
1 Number of sectors being output
or in case of a remap error
0 Result (error code)
1,2,3 Sector number of failure (all ffh if not applicable).

Description:
Set FvRdSecs to the number of sectors to be read;
Call FPageLst (with the FvUseChk=0 to indicate that usage checking is not required) to build a list in CPU RAM of pairs of actual flash pages required. Remapping of bad blocks will be performned at this state within FPageLst;
If remapping was successful;
Point FvFPPtr to the start of this list;
Set FvState to FREAD
Copy the request buffer offset 4 to response offset 1—i.e. the number of sectors being read.
Set FvesLen to 2;
Set FvRdSecs to the number of sectors which are to be read.
Clear FvRdStat and call FNextRd to read into RAM at address 0 the flash block which contains the page pointed to by FvRdPtr and to set the RAM address of the start of the required pair of pages which contain the requested sector data; FNEXTWR will not return to here.
Jump to FServExit with a =SUCCESS.
else:
Set FvState to FIDLE
Set FvResLen to 5
Return to FService with error.
endif

1.5.3 Read Absolute Flash Block+Tail (FhAbsRd)

Request:
Byte Offset Value
0 FSABSRD (2)
1,2,3 Absolute flash page number (must be on a block boundary)

Response:
0 Result (SUCCESS).
Number of sectors being output (=8).
2–17 Flash page tail.
or in the case of a flash read error
0 Result (error code)
1,2,3 flash page number of failure (all ffh if not applicable).

Description:
Call FBlocLst to build a list in CPU RAM of flash pages pairs to read. Each address will be two more than the last.
FvRdSecs to be 8 sectors i.e. one block;
Call the read flash tail function (FFlRdTl) to read the tails of the first two pages in the block and copy these into the response buffer (offsets 2–17);
Set FvState to FREAD;
Set the number of sectors being read in the response buffer (offset 1) to 8;
Set FvResLen to 18;
Set FvRdSecs to 1;
Clear FvRdStat and call FNextRd to read the flash block (as pointed to by FvFPPtr) into RAM at address 0 and to set the RAM address for the DMA transfer (to 0).
Jump to FServExit.
If an error occurs during reading the set FvState to IDLE and jump to FServExit with the error code.

1.5.4 Read Tails (FhRdTl)

Request:
Byte Offset Value
0 FSRDTAIL (3)
1,2,3 Absolute flash page number of first tail to read (must be on a block boundary)

Response:
0 Result (SUCCESS).
1–48 3*16 byte tails
or in case of a flash read error
0 Result (error code)
1,2,3 flash page number of failure (all ffh if not applicable).

Description:
Note: Ideally this would pack the sequential tails into a 512 byte output sector by transferring the tails into 512 bytes of the RAM and then transferring this to the MFM encoder. The problem with this is that a CRC calculation would then have to be performed over the 512 byte sector in the RAM. Although this is possible it is an unnecessary complication. For this reason the 49 byte response buffer is used instead, allowing the CPU to calculate a CRC over the data once it is in RAM.
Repeatedly call the read fash tail fiction (FFlRdTail) to read the tails of the first two pages of each block starting with the given page number and copy them into the response buffer (offsets 1–48);
If successful then
(Leave FvState as FIDLE);
Set FvResLen to 49;
else
Set FvState to FIDLE
Set FvResLen to 5
endif
Call FOutInit to start transmission;
Return result to FServExit

1.5.5 Write Services Overview

In general the write data services will set up a sequence of flash pages to write to in the same manner as the read data services. This array is interpreted by FNextWr which is called by the write data output loop after it has successfully received a sector of data from the PC. FNextWr is responsible for copying the data from the RAM device into Flash after it has been received by the FInFlash function. Before each page is received the Flash destination address is checked to see if the block is already in RAM. If it isn't then the previous block (if there is one) is written from the RAM to the Flash and the complete block which contains the next required page is loaded from Flash into the RAM. The erase operation on the block is the started and continues while the page is read from the decoder.

If the block is already in RAM then the RAM address is set to the position within the loaded block where the next page will go.

The first two tails in a given block contain information about the data that is stored in the block (i.e. the sector to Flash page mapping and the usage count). If this is the first time the block has been written to (i.e. the FORMATED byte in the tail is ffh), then FNextWr will initialise the tail data for the block when it is loaded into RAM.

If a write to the Flash fails then FNextWr will call FRemapWr to load the Remap Block number from the ERP tail and write the failed block data to it (and update the tails and make an entry in the ERP table). The Remap block is a Flash block previously designated for such emergencies by the PC and must be present before a write is allowed by the FlashDisk. A checksum over all the data in the sectors (upto 16) is sent with the service request. This is initialised by the service routine, updated as data arrives by FInFlash and checked by FNextWr.

1.5.6 Write Sectors (FhWrite)
Request:
0 FSWRITE (4)
1,2,3 Sector number
4 Number of sectors to write 1 to 16
5 Checksum over all the data sent for this request.
Response:
0 Result (SUCCESS)
1 Number of sectors remaining to be written
or in case of a remap error
0 Result (error code)
1,2,3 Absolute flash page number of failure (all ffh if not applicable)
Description:
Check the battery low line, BLOW PD3, and if the battery is low return an error;
Check FvWrStat to see if a valid Remap block is present, if not return an error,
Call FPageLst (with FvUseChk=1 to indicate that usage count checking is required) to build a list of actual flash pages required in CPU RAM. This may return a usage count exceeded error;
If remapping was successful:
Point FvFPPtr to the start of this list;
Set FvState to FWRITE;
Copy the request buffer offset 4 to response buffer offset 1—i.e. the number of sectors to be written (this will be decremented after each sector is received);
Set FvResLen to 2;
Save the data checksum form the request in FvReqChk;
Set bit 3 of FvWrStat to indicate first write and jump to FNextWr to copy the first Flash block from the address pointed to by FvFPPtr into RAM, update the usage count in RAM and start an erase operation on the flash block if necessary. It will also set the RAM address which the incoming sector data should be transferred to.
FNextWr will not return to here
else:
Set FvState to FIDLE
Set FvResLen to 5
Call FoutINt to start transmission of padding characters;
Return to FServExit with error.
endif
1.5.7 Write Absolute Flash Block+Tail (FhAbsWrt)
Request:
0 FSABSWR (5)
1,2,3 Absolute flash page number to write to (must be on a block boundary)
4–19 16 bytes of tail to write (CRC bytes will be ignored)
20 Checksum over all the data
Response:
0 Result (SUCCESS)
1 Number of sectors remaining to write (8 after first request, 0 after data received and written).
or in the case of a flash write error
0 Result (error code).
1,2,3,4 Absolute flash page number of failure (all ffh if not applicable).
Description:
Save the data checksum form the request in FvReqChk;
Call FBlocLst to build a list in CPU RAM of flash page addresses to be written to. Each address will be two more than the last.
Set FvState to FWRITE;
Write the request buffer offset 4–19 into the RAM where the tails of the first two pages of the data will be (i.e. 8 bytes of RAM addresses 256 and 8 bytes at ARM address 256+ 8+256–the 2 CRC bytes will be overwritten when the data arrives);
Set FvRes:em tp 2'
Set response buffer offset 1 to 7 to indicate the number of sectors to be written after the initial one.
Set bit 0 of FvWrStat to indicate to FNextWr that it should not read the flash block into RAM (do not call FNextWr).
Start the erase on the block.
Set bits 2, 3 and 4 of FvWrState to indicate that, respectively, the block has already been erased, this is the first write and this is an absolute write (i.e. FNextWr should not check the tail data);
Set the initial RAM transfer address to 0.
Set the sector header pointer,FvWrSHd, to its initial value;
Set the write sector number, FvWrSec, to its initial value.
Call FOutInit to start transmission;
Return to FServExit with SUCCESS or error.

1.5.8 Write Tail (FhWrtTl)
Request:
0 FSWRTAIL (6)
1,2,3 Absolute flash page number to write to the tail of
4–19 16 bytes of tail data to write (the CRC bytes will be ignored)
Response:
0 Result (error code)
1,2,3 Absolute flash page number of failure (all ffh if not applicable)
Description:
Set FvState to FIDLE;
Read the requested block from flash into the RAM.
Call FFlRdRAM to read the Flash block into the RAM
Call FFlErase to start the erase on the block and wait for the ready/busy line to indicate the erase has finished;
Write the request buffer offset 4–19 into the RAM where the tails of the first two pages of the data will be (i.e. 8 bytes at RAM addresses 256 and 6 bytes at RAM address 256+ {8+256+2–avoid overwriting the CRC);
Set FvResLen to 2;
Call FFlWrRAM to write the block from RAM to Flash.
In the event of an erase or write error set the page number of failure in the response buffer.
Call FOutInit to start transmission;
Return to FServExit with SUCCESS or error.

1.5.9 Next Write Function (FNextWr)
This function is called initially from the write sectors service handler and then from the write data output loop.
Description:
FvWrStat bits:
7—Error
6—Not used
5—Remap block is valid
4—Write is absolute
3—First write
2—Block already erased
1—Not used 0—Valid data in RAM If bit 7 of FWrState is set (i.e. previous error) then goto P;

If there are no more sectors to come (count in response buffer) then

Write the current block in RAM to Flash.
    If a write error occurs then
    If bit 4 of FWrState indicates this is not an absolute write then
        Call FRemapWr to remap the block.
        GotoExit.
    ELSE
    Check the data checksum.
    Goto Exit
ELSE Decrement the number sectors remaining (help in response buffer)

If bit 3 is not set (not first time) then
    Increment the page list pointer, FvFPPtr, to point to the next required page
    If the next page is not from the same block then
    Write the block in RAM back to Flash.
    If there was a write error then call FRempWr
    If there is no block in RAM (bit 0 of FvWrStat not set) then
        Read the block containing the next page into RAM.
        Start an erase on the block.
        If there is not an absolute write then
        Call FBlkForm to format the tail of the block it if necessary and increment the usage count held in the tail.
    Set the RAM address to the start of page expected.
    If there was an error set bit 7 of FvWrStat
    P: Increment the sector header pointers
    Start Outputting padding.
    Jump to FServExit.

Note: Even if there is a Flash write error the sector numbers will continue to increment so that the FDC can continue to write data and return control to the device driver which can then read the error from the response buffer. This is tidier than causing a FDC error by not outputting the appropriate sector header and will not cause the BIOS to retry the FDC command.

1.5.10 Next Read Function (FNextRd)

This flinction sets up the next RAM transfer address and if necesssry reads the appropriate block into RAM from flash.

Description:

Call FOutInit to kick off the transmission of the padding characters.

If bit 0 of FvRdStat is clear then read the block indicated by the FP pointed to by FvFPPtr into the RAM, set bit 0 of FvRdStat and set the RAM address to the requested page.

else

Move FvFPPtr on the next FP in the list if this is the terminating value then move FvFPPtr back to the start of the list;

If bit 0 of FvRdStat is set then compare the block indicated by the FP pointed to by , FvFPPtr with the previous FP in the list (if FvFPPtr is at the start of the list then compare it with the value at the end of the list). If they are different then read the block indicated by the FP pointed to by FvFPPtr into the RAM. (This may be simplified if a variable is used to store the block number of the current block in RAM).

Set the RAM address to the position of the page pointed to by FvFPPtr.

Read the tail of the block from RAM and if it is not formatted then insert a CRC for all ffh into the requested page's tail.

Returns to caller.

1.6 Flash Device Control

These functions provide the means to access the Flash devices.

1.6.1 Enable Flash Chip FFlChipE

This will latch the chip enable line of the given chip number. This function must be called before the Flash can be accessed. While any of the Flash chip select lines are high the RAM device cannot be accessed.

Preserve both x and a registers and the direction of Port A.

This take:

FFlAdr1—Chip number (starting from 1) of chip to activate.

Description:

Put the chip number on Port A.

Toggle the CELATCH on PC0 to latch the chip number.

Restore the direction of Port A.

1.6.2 Deselect all the Flash Chips FFlChipD

This will latch 0 into the chip select state by toggling PC0. The x and a registers and the Port A direction register must be preserved.

1.6.3 Send Flash Command and Address to Flash Chip FFlCdAdr

This will enable the chip select of the appropriate Flash chip, send the given command byte and then send the 2 byte Flash page address. The chip will be left enabled on exit of this function. See Toshiba specification for details of the sequence.

This takes:

FvFlAdr1 —The chip number to select.
    FvFlAdr2 (2 bytes)—The 2 byte Flash page address.
    a reg—The Flash command byte.

1.6.4 Read Flash Page Tail FFlRdT1

This will read the tails of two pages starting with the given page number. It will store the 16 bytes of data into a fixed location in CPU RAM—FvFlTail.

This takes:

FvFlAdr1—Flash chip number.
    FvFlAdr2 (2 bytes)—Flash page address.

Returns:

a reg—Result code.

This uses Read Cycle (2) (Tosh Tech Doc p. 10) to read the 8 byte tail from each flash device.

1.6.5 Read Flash Block into RAM (FFlRdRAM)

This takes:

FvFlAdr1 —Flash chip number.
    FvFlAdr2 (2 bytes)—Flash page address.

Returns:

a reg—Result code.

This issues read cycle (1) without clocking out the data (this is left to be done by the DMA controller). Then it enables the DMA controller to transfer the data into RAM at address 0 by:

setting the RAM transfer address (using FRAMAddr);
    clearing the DMA direction bit PC4 (DMADIR);
    Call FFlCdAdr to enable the flash and send the command Flash page address.
    Call FWait to wait for the Flash to become ready (with a timeout).
    repeating 16 times {
    pulse the DMA enable bit PB3 DMAEN);
    wait for~Busy to be set;
    }
    Call FFlChipD to deselect the Flash chips.

1.6.6 Write Flash Block from RAM (FFlWrRAM)
This takes:
FvFlAdr1—Flash chip number.
FvFlAdr2 (2 bytes)—Flash page address.
Returns:
a reg—Result code.

This issues the auto program command starting sequence but stops after the address has been written so that the data can be written by the DMA controller from RAM by:
setting the RAM transfer address to zero (using FRAMAddr);
setting the DMA direction bit PC4 (DMADIR);
repeating 16 times {
Call FFlCdAdr to select the Flash chip, and send the command and address.
issue the auto program command sequence
pulse the DMA enable bit PB3;
wait for~BUSY to be set.
finish the auto program
Wait for the progam to finish then call FFlChk to read the status. If error then stop programming.
}
Call FFlChipD to deselect the Flash chips.

1.6.7 Erase Flash Block (FFlErase)
This starts an erase operation for the given block but does not wait around for the erase to complete.
This takes:
FvFlAdr1—Flash chip number.
FvFlAdr2 (2 bytes)—Flash page address.
This can not use FFlCdAdr because the address sequence is different.

1.6.8 Read Flash Chip ID Code (FFlIdRd)
This reads the Flash chip's Maker and Device codes.
Returns
a reg—Device code
x reg—Maker code

1.6.9 Reset Flash Chip (FFlReset)
Sends the reset command to the given Flash chip.
This takes:
FvFlAdr1—Flash chip number.

1.6.10 Check Flash Operation Result (FFChk)
Test the result of the previous Flash operation. Returns an error code in the a reg.

1.7 RAM Device Control

1.71 Set RAM Address (FRAMAdr)
Sets the current RAM address.
Takes:
FvRAMAdr—a two byte RAM address.

1.7.2 Write Bytes to RAM (FRAMWr)
Writes a number of bytes from the CPU RAM to the RAM device at the current address.
Takes:
a reg—The number of byes to write.
x reg—CPU RAM address of bytes to write

1.7.3 Read Bytes from RAM (FRAMRd)
Reads a number of bytes from the RAM device at the current address to the CPU RAM at the given address.
Takes:
a reg—The number of byes to write.
x reg—CPU RAM address of bytes to

1.7.4 Convert Flash Page Address to RAM Address (FPG2RAM)
Uses the page offset into the given Flash block to determine the RAM address of that page if the block is loaded at address 0 of the RAM.
Take:
FvFPPtr—Points to the 3 byte Flash address.
Returns:
FvRAMAdr—The two byte RAM address.

1.8 Utility Functions

1.8.1 Waits for Ready/Busy to be Ready or Timeout Occurs (Fwait)
Uses a program loop to determine if a timeout has occurred whilst waiting for the read/busy to go high.
Returns:
a reg—SUCCESS or timeout error.

1.8.2 Wait for a Multiple of 8 us (Fwait Byte)
Used by the output functions to wait for a given number of bytes to be sent by the encoder. Must use instruction timed code.
Take:
x reg—Number of bytes to wait (min 2)
The time in this routing (including entrance/exit code) is $((x*16)-8)$us.

1.8.3 Read a Tail from RAM device into CPU RAM (FRdTlRAM)
This reads the 16 byte tail of a block in the RAM device (at address 0) into the CPU RAM at FvFlTail.
Returns:
FvFlTail—The 16 byte tail.

1.8.4 Wire a Tail from CPU RAM to the RAM Device (FWrTlRAM)
This writes the 16 byte tail in the CPU RAM at FvFlTail to the block in the RAM device (at address 0).
Takes:
FvFlTail—The 16 byte tail.

1.8.5 Calculate the CRC Over a Tail (FCRCTl)
Calculates the CRC over a tail in FvFlTail (bytes 0–5 and 10–13).
Takes:
FvFlTail—The 16 byte tail.
Returns:
FVCRC1 and FvCRC2—The two byte CRC result.

1.8.6 Increment Usage Count (FIncUse)
Increments the usage count of the tail in FvFlTail.

1.8.7 Format Tail of Block (FBlkForm)
Checks that the current block in RAM has been formatted (byte 13 of tail). If not it will format it by writing the Flash address and its (unmapped) sector number and zeroing the remaining bytes (except the data CRC).
Takes:
FvFlAdr1—Flash chip number.
FvFlAdr2 (2 bytes)—Flash page address.

1.8.8 Convert Flash Address to Sector Number (FFP2Sec)
Converts the given 3 byte Flash address into the corresponding (zero based) sector number.
This takes:
FvFlAdr1—Flash chip number.
FvFlAdr2 (2 bytes)—Flash page address.
x reg—Pointer to storage for the 3 byte sector number.
ps 1.8.9 Convert Sector Number to Flash Address (FSec2FP)
Converts the given 3 byte sector number into the corresponding Flash address.
This takes
x reg—Pointer to the 3 byte sector number.
Returns:
FvFlAdr1—Flash chip number.
Fvf1Adr2 (2 bytes)—Flash page address.

1.8.10 Check Tail CRC (FChkTl)

Checks the CRC of the tail given in FvFlTail.

Returns:

a reg—SUCCESS or error

1.9 Mapping Module

Functions in the mapping module are responsible for performing the translation from FlashDisk sector numbers to absolute flash page addresses and for dealing with remapping write failures.

This is achieved by storing the following data in the 16 bytes of the first two tails of each Flash block:

Bytes 0–2 FP Number of the Flash page which stores the data for this sector.

Bytes 3–5 SEC Sector number of the data stored in this Flash page.

Bytes 6–7 CHK CRC checksum over Bytes 0–5 and 10–12.

Bytes 8–9 CRC CRC over the data in this page.

Bytes 10–12 USE Number of times this page has been written to.

Byte 13 ERAS Indicates if the block is formatted.

It is the responsibility of the FBlkForm function to initialise these values when the block is first written to (detected by the ERAS byte being FFh).

Each FlashDisk also has an area reserved for storing sector to Flash address mappings of blocks that have failed, and have thus been moved. This area consists of a number of Flash pages known as the Emergency Remap Pages (ERPs). There are two blocks reserved for ERPs at the very top of the FlashDisk memory (i.e. the last two blocks of the highest numbered Flash chip installed). The second block is a backup if the first one fails. The tails of the first two ERPs in the block is also used for storage of the Flash address and usage count of a block (the Emergency Remap Block) that can be used as a replacement if another block fails during a write. This is initialised by the PC sending a service request containing the sector number of a block it has marked as bad in the FlashDisk FAT. Note that this is a sector number and thus may be a block that has already failed itself, and if so will have an entry in the ERP. No writes will be allowed until there is an emergency remap block available (absolute writes are not included in this ban).

Each entry in the ERP consists of,

Bytes 0–2—Sector number (LSB first).

Bytes 3–5—Flash address (chip number then page address) of Flash block that contains the 8 sectors starting from the on given in bytes 0–2.

All unused entries must have at least the byte 0 set to FFh as this indicates the end of used the ERP entries. Each ERP contains 42 of these entries, with the remaining 4 bytes of the page being skipped. Thus there are a maximum of 672 entries in the ERP block.

The format of the tail of the first two ERPs (interpreted as one 16 byte tail) in the block is, Bytes 0–2—Flash address (chip number then page) of the Emergency Remap Block.

Bytes 3–5—Unused (may contain anything).

Bytes 6–7—CRC over bytes 0–5 and 10–12 (same as normal tails).

Bytes 8–9—Unused.

Bytes 10–12—Usage count of Emergency Remap Block.

Bytes 13–15—Unused.

There is also a checksum over all the bytes in the ERP block, excluding the last byte of each page and the tails. The checksum is a simple addition modulo 256. The result is stored in the last byte of the last ERP. If the checksum is incorrect the secondary ERP block is used.

1.9.1 Remap (FMapPg)

This is the function which is used to generate a Flash address from a sector number. It uses the tail information and the ERPs to determine the actual location of the data for the requested sector.

Takes:

Bytes 1–3 of the request buffer contain the sector number.

Returns:

FvFlAdr1—Chip number of Flash address

FvFlAdr2 (2 bytes)—page address.

a reg—Result code.

Description:

Check that the sector number is in range by comparing with FvMaxSec which was initialised at boot.

Call FSec2FP to convert the sector number to the corresponding Flash address.

Load the tail of the Flash block at that address.

Call FChkT1 to check the tails checksum If the block is unformatted then return the address just calculated as being the address for the requested sector. If the checksum is wrong then the block is assumed to be bad and thus FMapEek is called to look in the ERPs for an entry for the sector number. If there is one then the Flash address given with that entry is returned.

If the checksum is OK then copy the Flash address from the tail into FvFlAdr and load the tail for that block. Note that if the block has not been moved then this tail is the same one as before, but if the block has been moved then it will be the tail of the block that contains the data for the requested sector.

Check the checksum of this new tail. If it is incorrect then call FMapEek to look in the ERPs for an entry for the given sector number.

If the checksum is OK then the address currently in FvFlAdr is the one that contains the data for the sector.

1.9.2 Create Page List (FPageLst)

Takes a starting sector number from the buffer (bytes 1–3) of either a read or write sectors service request and a number of sectors in the 'x' register. Calls FMapPg 'x' times to remap each of the sectors in a request. Stores the resulting 3 byte FPs in an array starting at FvPgLst (max 17 entries). The array is terminated with an FP of all FFh. Returns SUCCESS or an error code in 'a'.

1.9.3 Create Block List (FBlocLst)

Takes a starting flash page in FvFlAdr of either a read or write sectors service request. Creates a list of 8 FPs in FvPgLst. each being 2 greater than the last. Terminates the array with an FP of all FFh.

1.9.4 Emergency Remap (FMapEek)

This function is called when the tail of a block is found to have an incorrect checksum indicating that the block has failed. Thus there may be an entry for the sector number in the ERPs which will give the Flash address of the block which now contains the sector data for the given sector number.

Take:

Bytes 1–3 of request buffer contain the sector number.

Returns:

FvFlAdr1—Chip number of Flash address.

FvFlAdr2 (2 bytes)—Page address.

a reg—result code.

Description

Call FERP2Ram to load the ERPs into the RAM device (loads backup if necessary).

If the ERPs were loaded then call FERPSrch to search the ERPs to search for the sector number pointed to by the x reg. Retwiis the Flash address in FvFlAdr if an entry was found.

1.9.5 Remapping of Write Failures (FRemapWr)

When this function is called (by FNextWr) the data for the failed block is in the RAM device. This function will attempt to move data in the block to the Emergency Remap Block and add an entry for the sector number whose data is stored in the block to the ERPs. The tail of the failed block must be made invalid (by writing zeros to it) to ensure that this new mapping gets used the next time the sector is read from, or written to.

The process is complicated by possibility that the block has been moved (as part of an even wear scheme) and thus the need to update the tail from another block. Note that it is possible that this update may fail thus destroying data from another sector. It must be assumed that the odds of this happening are remote, otherwise the task becomes impossibly complicated.

In reorganising the tails there are four cases to consider in two groups,

Group 1: the block has been remapped before (indicated by the 1st byte of the SEC entry in the tail being set to FFh) i.e. it was used when a previous block failed and has itself now failed. The two cases of this group depend on the state of the tail at the address pointed to by the FP entry in the failed block's tail (FPt).

a) the checksum of the FPt tail block's is OK so that block has not failed previously. The FP entry of the FPt block's tail must be updated to point to the Emergency Remap block.

b) the checksum of the FPt block's tail is incorrect, so that block has failed previously. this means there is already an entry in the ERPs for the sector number of the data contained in the failed block. This entry must be updated with the Flash address of the Emergency Remap block.

Group 2: The block has not previously been remapped. The two cases of this group depend on whether the block has been swapped with another block, and thus the actual data in the failed block is not for the sector that directly relates to its Flash address, it is the data for the block pointed to by the FP entry in the block's tail. This can be determined by calculating the Flash address that directly corresponds to the sector number contained in the SEC entry of the failed block's tail. If this address matches the actual address of the failed block then the block has not been swapped.

a) the block has not been swapped. Add the sector number in the SEC entry of the failed block's tail to the ERPs with the Flash address of the Emergency Remap Block.

b) the block has been swapped. Add the sector number that directly corresponds to the failed block's address to the EPRs with the Flash address in the FP entry of the failed block's tail. Load the block pointed to by the FP entry in the failed block's tail and updates its tail with the Flash address of the Emergency Remap Block.

1.10 ERP Manipulation Routines

These functions allow access to and updating of the ERP block.

1.10.1 Service Routine to Add a New Remap Block (FhNewBlk)

This routine is used by the PC to send the FlashDisk a sector number which can be used by the remapping functions when a writ fails. Note that the PC sends a sector number and as such it is possible that the sector has itself been remapped or swapped.

Request buffer offset:
0=Service code (FSNEWBLK)
1–3=Sector number of new remap block Returns
Response buffer offset:
0=Result code.
Description:
Set the response length FvResLen to 1.
Set the state to idle.
Call FERP2Ram to load the ERPs into the RAM device.
Call FSec2FP to convert the sector number to a Flash address.
Call FFlRdRAM to load the new block into the RAM.
Call FFlRdRAM to load the new block into the RAM.
Call FBlkForm to fonnat the tail if necessary.

At this point the tail will contain all that is necessary to store in the ERP block. If the block has been remapped then the FP entry will contain the Flash address of the block it was moved to (which is the block we actually want), and if not the FP entry will contain the FP of the block we have just loaded (again what we want). Thus FWrERPT1 can be called to write the tail to the ERP block and then FRam2ERP can be called to write the ERP block back to Flash.

Clear bit 5 of FvWrStat to indicate an Emergency Remap block is available and thus writes are permitted.

Call FOutInit and jump to FservExit.

1.10.2 Load the ERP Block from Flash into RAM (FERP2Ram)

This loads the ERP block from the Flash and checks its checksum. If it is incorrect then the backup copy is loaded and checked. The ERP tail is returned in FvFlTail. The address variables FvFlAdr1 and FvFlAdr2 must be preserved.

1.10.3 Write the ERP Block from RAM to Flash (FRam2ERP)

This function recalculates the tail checksum and the ERP check byte then attempts to write the block to the primary ERP block first. If this fails it is written to the backup block. The address variables FvFlAdr1 and FvFlAdr2 must be preserved.

1.10.4 Adds an Entry to the ERP Block (FAdd2ERP)

If there is already an entry for the given sector number then that entry is updated with the new Flash address, otherwise a new entry is appended to the end of the ERP. Both the sector number and the Flash address will be aligned to the Flash block boundary before being added.

Takes:

x reg—Points to sector number to add.

FvFlAdr1—Chip number of Flash address to add.

FvFlAdr2 (2 bytes)—Page address of to add.

Returns:

a reg—Result code.

1.10.5 Search ERPs for an Entry (FERPSrch)

Searches the ERP list for an entry which matches the given sector number and returns the Flash address for that entry. The RAM address must be left so that the next read/write to the RAM will occur at the first byte of the sector number or at the next free entry if no match was found. The function will return a different error for entry not found and ERP block full. Before searching the sector number must be block aligned.

Takes:

x reg—Points to sector number to search for.

Returns:

a reg—Result code.

FvFlAdr1—If match found contains the chip number.

FvFlAdr2 (2 bytes)—If match found contains the page address.

1.10.6 Read ERP Tail from RAM (FRdERPTl)
Reads the 16 byte ERP tail from the ERP block in RAM into CPU RAM at FvFlTail.
1.10.7 Write ERP Tail to RAM (FWrERPTl)
Writes the 16 byte ERP tail from CPU RAM at FvFlTail to the ERP block in the RAM.
1.10.8 Check ERP Block Checksum (FERPChk)
Calculates the ERP checksum over the ERP block currently loaded in the RAM. The checksum is over all bytes except the last byte of each page and the tail bytes. The checksum result is stored in the last byte of the last page of the block and also returned in FvERPChk.
1.11 PC Boot Code and FAT Emulation
The FlashDisk will be bootable and contain a small program to intal the device driver. This is possible by the transmission of 5 hard coded sectors from ROM. These sectors will star from is sector 1 (the boot sector) which will, if booted on, call the hard disk boot sector. Following this are two sectors of FAT (sectors 2 & 3), then a one sector root directory (sector 4) and finally a one sector install program (sector 5).

The install program is the only entry in the FAT and root directory. This will appear as drive A: to the PC. Thus typing A:INSTALL will run the intal program which is a simply boot strap program which loads a larger program from a reserved area of Flash (sectors 1 to 16 of the FlashDisk are configured as reserved in the boot record). This larger program will copy the device driver from the Flash (in the area immediately after the program itself) and update the config.sys.

Note that the last sector of the reserved area (sector 16) is reserved for use by the PC.
2 PC Software
2.1 Protocol Layer
This layer is responsible for interacting with the FlashDisk via Int 13h. It will be responsible for sequence number and CRC checking of the response buffer and recovery of these errors.
2.12.1 Send Service Request to FlashiDisk (FDP_Request)
Write errors (except for sector not found) are handled within fdp_bios_write. Read errors are handled within fdp_bios_read.

Since the appropriate retries have already been performed, this function simply returns the error code in the event of such errors.
Entry:
FDPv_Request_buffer—Initialised with the required service code and data
Exit:
AH—Result code.
FDPv_Response_Buffer—Response from FlashDisk
Description:
Preserve the ES:BX and AL registers.
Copy sequence number FDPv_Seq_num to Request buffer offset1.
Increment the sequence number FDPv_Seq_num.
Repeat max FDP_SEQ_RETRIES times
Set ES:BX to point to start of Request buffer.
Call fdp_bios_write with AL=1 (number sectors) and CL=200 (start sector) to send the Request buffer.
  If sector not found error then goto Repeat, all other errors cause exit.
  else
    Set ES:BX to point to start of Response buffer.
    Call fdp_bios_read with AL=1 (nunber sectors) and CL=100 (start sector).
    Compare the sequence number in the response buffer with
    FDPv_Seq_num. If different then goto Repeat.
    All other read errors exit.
2.12.2 Write Sectors to FlashDisk (FDP_Write)
Writes sector data to the FlashDisk. This should be called after sending a write service request to the FlashDisk.
The FlashDisk should then be outputting a sequence of the appropriate sector headers to write to.
Entry:
AL—Number of sectors to write (1 to 16).
FDPv_Request_buffer—Initialised with the required service code and data.
ES:BX—Pointer to buffer containing data.
Exit:
AH—SUCCESS or E_FDP_WRITE_FAILED
FDPv_Response_Buffer—Response from FlashDisk
Description:
Preserve the ES:BX and AL registers.
Call Fdp_CRC_buffer to calculate the CRC over the request buffer.
Set Fdpv_sector_number=201
Save a copy of FDPv_Seq_num
Save the requested number of sectors and the buffer pointer ES:BX.
Repeat max FDP_SEQ_RETRIES times
Call fdp_bios_write with CL=Fdpv_sector_number to send the data.
If write was successful then
Increment FDPv_Seq_num by sectors written.
Set ES:BX to point to start of Response buffer.
Call fdp_bios_read with AL=1 (number sectors) and CL=100.
Read the sequence number from the response buffer.
If sequence number 1=FDPv_Seq_num or sector not found then
  Set Fdpv_sector_number to the sector given in the response.
  Reset FDPv_Seq_num to the value in the response.
  Set AL=Requested number sectors—number successfully sent
  Set ES:BX=Start buffer+(number sent*512).
  Goto Repeat.
else
If sector not found error then goto Repeat.
2.12.3 Read Sectors from FlashDisk (FDP_Read)
Reads sectors from the FlashDisk.
Entry:
AL—Number of sectors to read (1 to 16).
FDPv_Request_buffer—Initialised with the required service code and data.
ES:BX—Pointer to a buffer to put the data.
Exit
AH—Result code.
FDPv_Response_Buffer—Response from FlashDisk
Description:
Set up FlashDisk ID byte.
Calculate the CRC over the buffer.
Increment the sequence number.
Call fdp_bios_write to send the request. Repeat for sector not found error only.
Call fdp_bios_read to read the data from the FlashDisk. If the sequence number is incorrect then exit Input errors are retried a number of times.

2.12.4 Write Data to FlashDisk (fdp_bios_write)

Uses the BIOS to write sectors to the FlashDisk. If a disk changed error is detected the fdpv_disk_changed flag is set.

Entry:
AL—Number sectors to write.
CL—Starting sector number of write.
ES:BX—Address of data to write.
Exit
AH—Result code.
Description:
Save contents of AL.
Set DL=FDPv_Drive
   CH=0
   DH=0
   Other registers remain as given.
Repeat until successful, sector not found error or FDP_WRITE_RETRIES times.
   Set AL=Requested number sectors.
   Call int 13h write function

2.12.5 Read Data from FlashDisk (fdp_bios_read)

Use BIOS to read sectors from the FlashDisk.
Entry:
AL—Number sectors to read.
CL—Starting sector number of read.
ES:BX—Address of buffer to put data in.
Exit
AH—Result code.
Description:
Save contents of AL.
Set DL=FDPv_Drive
   CH=0
   DH=0
   Other registers remain as given.
Start a timer.
Repeat until successful, timeout or there were FDP_READ_RETRIES CRC errors.
   Set AL=Requested number sectors.
   Call int 13h read function

2.12.6 Calculate the CRC over the Request Buffer (fdp_CRC_buffer)

Entry:
FDPv_Request_buffer—Buffer for which CRC must be calculated.
Exit:
AH—SUCCESS
Description:
Clear all the bytes after the request buffer upto 512 bytes
   Calculate the CRC over the Request buffer and store result after it.

2.12.7 Test dksi Changed Flag (FDP_disk_changed)

Test the fdpv_disk_changed to see if a disk changed error was returned when a write was attempted. Returns,

```
ah = 1 (Disk not changed)
   = 0 (Don't know)
   = -1 (Disk Changed)
```

Calling this function causes the flag to be reset to 'Disk not changed'.

2.12.8 Initialise Drive (FDP_Init_drive)

Entry:
AL—Drive to use for FlashDisk (0 or 1).
Exit:
AL—Drive now being used (0 or 1).
Description:
Set the drive variable fdp_drive to AL.
Reset the sequence number, fdp_seq_num.

2.12.9 Find FlashDisk Drive (FDP_find_flashdisk)

Exit:
AL—Drive now being used (0 or 1).
AH—Result (i.e. A FlashDisk was found or not).
Updates fdpv_drive.

2.2 Data Layer

This layer receives a request for an arbitrary number of sectors, which it must split into the 16 sector blocks required by the protocol layer. It will also be responsible for formulating the required request in the Request buffer.

Another responsibility of this layer is to manage the sending of new Emergency Remap Blocks when the FlashDisk signals that it has used its remap block.

2.13.1 Emergency Remap Blocks—overview

Emergency Remap Blocks are unused clusters (8 sectors) that have been marked as bad in the FAT by the device driver. They can then be sent to the FlashDisk for use when another block fails. In an attempt to make write errors transparent to DOS the device driver should be able to deal with them without returning to DOS. Because it is not possible to update the FAT while in the middle of a write, the device driver must gather and store a number of sectors that it can use as remap blocks before the write is started.

The only time that it is safe to modify the FAT is when DOS calls the Build BPB device driver function which always occurs before the first write to a drive and then after every media change. It is thus during the build BPB call that the FAT is searched for free sectors to use as remap blocks.

Another requirement is that the information about which blocks have been reserved must be retained while the power is off (or if a different FlashDisk is inserted). To achieve this the information is stored on the FlashDisk itself in a special reserved sector (sector 16). This is loaded each time Build BPB is called and topped up if necessary. Note that because this involves writing to the FlashDisk sectors there must be a remap block on the FlashDisk beforehand. This could cause problems the first time the FlashDisk is used, so as part of the initialisation a remap block must be installed.

The format of the data stored in the remap block sector is as follows,

Number of remap blocks currently valid;
10×4 byte sector numbers of the remap blocks;
One byte checksum over the previous bytes;
Remainder of sector is unused at present.

When a new remap block has to be sent one is taken from the end, the number of valid ones reduced and the checksum recalculated. New remap blocks from the FAT are then added over the top i.e. the system is first in-last out.

2.13.2 Write Sectors to FlashDisk (FDD_Write_Sectors)

Entry:
DS:SI points to the following structure:
word—Number of sectors to write.
dword—Starting sector number.
dword—Pointer to data buffer.
Exit:
AL—Result code
Description:
Set ES:BX to the start of the data buffer.

For each block of up to 16 sectors repeat the following:
Call Fdd_Calc_checksum and store result in request buffer.
Set data buffer offset
0—Write service code (FSWRITE).
1,2,3—Start sector number of current block.
4—Number sectors to write this block.
Call FDP_Request to send the request buffer to the FlashDisk.
All comms errors exit with error code.
Call fdd_check_request_response to determine if the FlashDisk doesn't have a remap block (and if so send it one) and cause a retry (upto some maximum) of the request.
Call FDP_Write with AL set to the number of sectors write this block.
All comms errors cause an exit.
Call fdd_check_write_response to check the FlashDisk response code for a checksum error or a remap block used error (if so send it a new one). Both these errors cause a retry (upto some maximum) of the request and the write for this block only.
Increment the data pointer by 16 sectors and the start sector number by the number of sectors sent this time.
When finished or error, return the number of sectors that were actually written.

2.13.3 Read Sectors from FlashDisk (FDD_Read_Sectors)
Entry:
DS:SI points to the following structure:
word—Number of sectors to read.
dword—Stardng sector number.
dword—Pointer to data buffer.
Exit:
AX—Result code
Description:
Set ES:BX to the start of the data buffer.
For each block of upto 16 sectors do the following:
Set data buffer offset
0—Read service code (FSREAD).
1,2,3—Start sector number of current block.
4—Number sectors to write this block.
Call FDP_Read to send the request and read the sectors from the FlashDisk.
All comms errors or FlashDisk errors cause exit.
Increment the pointer in ES:BX by 16 sectors.
Increment the start sector by 16 sectors.
When finished or error, return the number of sectors that have been read.

2.13.4 Write Absolute Flash Block+Tail (FDD_Write_Block)
Entry:
DS:SI points to the following stwcture:
dword—Flash address to write to.
dword—Pointer to buffer containing 16 sectors of block data.
dword—Pointer to buffer containing 16 bytes of tail data.
Exit:
AX—Result code
Description:
Set ES:BX to the start of the data buffer.
Set data buffer offset
0—Absolute write service code (FSABSWR).
1,2,3—Flash address of block to write to.
4–19—The 16 bytes of tail data.
Calculate the checksum over the data.
Call FDP_Request to send the request buffer to the FlashDisk.
Call FDP_Write to write the block.
Return result of write.

2.13.5 Read Absolute Flash Block+Tail (FDD_Read_Block)
Entry:
DS:SI points to the following structure:
dword—Flash address to read.
dword—Pointer to buffer to receive 16 sectors of block data.
dword—Pointer to buffer to receive 16 bytes of tail data.
Exit:
AX—Result code
Description:
Set ES:BX to the start of the data buffer.
Set data buffer offset
0—Absolute read service code (FSABSRD).
1,2,3—Flash address of block to read.
Call FDP_Read to read the block.
Copy the tail data from the response buffer to tail buffer.
Return result of read.

2.13.6 Exchange Request/Response (FDD_Request_Response)
Entry:
DS:SI points to a request/response buffer
Exit:
AX—Result code
Description:
Copy the data form DS:SI into the request buffer.
Call FDP_Request to send the request buffer to the FlashDisk.
Copy the data section of the response buffer into DS:SI
Return result sending the request.

2.13.7 Calculate Data Checksum (fdd_Calc_checksum)
Entry:
AL—Number of sectors in buffer.
ES:BX—Pointer to data buffer.
Exit:
AX—Checksum result.
Description:
Calculate the checksum for the given number of sectors.
Return the two byte result in AX.

2.13.8 Initialise Drive (FDD_Init_Drive)
Entry:
AL—Drive to initialise (0 or 1).
Exit:
Ah—Drive number.
Description:
Calls FDP_Init drive 2.13.9 Find FlashDisk Drive (FDD_find_flashdisk)
Exit:
AL—Drive number with FlashDisk in.
AH—SUCCESS or no drive found.
Description:
Call FDP_find_flashdisk 2.13.10 Detect if Disk Changed (FDD_disk_changed)
Exit:
AH—1=Disk not changed
0=Don't know
−1=Disk changed

2.13.11 Check Response to a Write Request (Fdd_check_request_response)

Exit:

AH—Result

Called after sending a write request to the FlashDisk. If the error is a 'No Remap Block Available' error then, (if not return the result that was in the response buffer)

Call FDD_get_num_rblocks to get the number of remap blocks currently available.

If there are none left then return an error.

Call fdd_send_next_new_rblock to send the next available remap block to the

FlashDisk and remove it from the list of available ones.

Call FDD_update_rblock_list to send the revised remap block list to the reserved sector on the FlashDisk Return an error to indicate that the request should be retried.

2.13.12 Check the Response to Writing Sectors (fdd_check_write_response)

Called after attempting to write to a FlashDisk.

Exit:

AH—Result code.

If the response was a checksum error then force a retry of the write.

If the response was 'Remap Block Used' then,

Call FDDget_num_rblocks to get the number of remap blocks currently available.

If there are none left then return an error.

Call fdd_send_next_new_rblock to send the next available remap block to the FlashDisk and remove it from the list of available ones.

Call FDD_update_rblock_list to send the revised remap block list to the reserved sector on the FlashDisk.

Return an error to indicate that the request should be retried.

Otherwise return the response that was in the buffer.

2.13.13 Get the Number of Remap Blocks Available (FDD_get_num_rblocks)

Exit:

AL—Number of remap blocks available.

2.13.14 Send Next Available Remap Block Sector (fdd_send_next_new_rblock)

It is assumed that there is a remap block available to send. The sector number is copied from the remap block table in memory to the request buffer which has been set up with a 'Set new Remap Block' request. FDP_Request is then called to send this to the FlashDisk. If the request was accepted then the count of available remap is decremented and the checksum recalculated.

2.13.15 Update the Remap Table on the FlashiDisk (FDD_update_rblock_list)

Copies the remap block table from memory to the reserved sector (16) on the FlashDisk using normal write sector requests. The write is only retried if a checksum error occurs. Because it uses normal sector writes if the write fails then it will be remapped. This means that the update can only happen if the FlashDisk has a valid remap block.

2.13.16 Read the Remap Table from the FlashDisk (FDD_get_rblock_list)

Reads the table of available remap sectors from the reserved sector on the FlashDisk (16) into the copy in memory and checks its checksum. If the checksum is incorrect the table must be set to empty to ensure that now data is overwritten.

2.13.17 Add a New Sector to the Remap Table (FDD_add_to_rblock_list)

Entry:

DX:AX—Sector number to add.

The sector number is added to the end of the list, the number of valid entries increased and the checksum recalculated. No checking is done for adding past the maximum number of entries.

2.3 PC Device Driver

The section will only detail the additions that have to be made to make a standard device driver into a FlashDisk device driver. Details of device drivers can be found in the relevant literature.

The FlashDisk device driver supports the following device driver functions:

0—Initialisation
1—Media check
2—Build BPB
4—Read sectors
8—Write sectors
9—Write/Verify sectors (same as function 8 in FlashDisk)
13h—Generic IOCTL.
17h—Get logical device.
18h—Set logical device.

The Generic IOCTL function (13h) has several sub-functions, of which only the following are supported, 42h—Format track (simply returns SUCCESS)
40h—Set drive parameters.
60h—Get drive parameters.
62h—Verify track (simply returns SUCCESS)

the device driver header attributes are 2042h. This signifies that the FlashDisk device driver is a block device, supports 32 bit sector numbers, that generic IOCTL and logical drive mapping functions are supported, IOCTL queries are not supported, open device and close device are not supported, that we do not require the FAT on Build BPB and that IOCTL read/write is not supported.

2.14.1 FlashDisk Device Driver Initialisation

This is a function called by DOS only once at boot time. At this point we have the opportunity to read the settings from the config.sys. The FlashDisk device driver has only two switches, A and B, which signify which floppy disk drive the device driver is to use e.g.

DEVICEHIGH=FLASHDSK.SYS A or

DEVICEHIGH=FLASHDSK.SYS b

If neither of these switches is present the device driver must call FDD_find_flashdisk in an attempt to determine which drive to use. This will default to drive A: if no FlashDisk is found.

Finally the initialisation calls FDD_Init_drive to initialise the settings with whatever drive it has determined.

2.14.2 Media Check

This function is called by DOS to determine if the disk has changed. A flag is used to indicate that a media changed error has occure when reading or writing to the FlashDisk. The function FDD_disk_changed is used to access this flag.

2.14.3 Build BPB

The BPB (BIOS Parameter Block) contains information about the structure of the disk (e.g. number sectors, cluster size etc.). Since we can not guarantee that a FlashDisk is present on boot we must have a general BPB which we supply if we can't find a FlashDisk. This copy is then updated by trying to read the FlashDisk's BPB when DOS calls the Build BPB function. The BPB is contained in the boot sector of the FlashDisk and can be read, using FDD_Read_Sectors into a buffer (DOS provides a one sector buffer to this function) and then copying the BPB into our local table.

Since this function gets called when DOS thinks that its internal copies of the FAT are invalid it is safe for this function to modify the FAT. Thus it is from here that the Fdv_get_more_rblocks function is called which traverses the FAT looking for unused sectors to top up our list of remap blocks. Another advantage is that DOS provides a one sector buffer which we can use as we please.

2.14.4 Write Sectors

This function gets the transfer address, start sector number, and number of sectors from the device driver request and then called FDD_write_sectors.

2.14.5 Read Sectors

This function gets the transfer address, start sector number, and number of sectors from the device driver request and then call FDD_read_sectors.

2.14.6 Generic IOCTL Request

The Get Drive Parameters functions use the information in our copy of the BPB to fill in the drive parameters while the Set Drive Parameters functions updates our BPB. The Format Track and Verify Track function simply return success.

2.14.7 Logia Drive Mapping

The Set Logical Drive Mapping copies the drive number from the request into our global variable, while Get Logical Drive Mapping returns the contents of this variable.

2.14.8 Top up the Remap Block list (Fdv_get_more_rblocks)

This loads the remap block list from the FlashDisk reserved sector into memory and tests to see if any more remap sectors are required. If more are required then the FAT is traversed to look for unused clusters which are marked as bad and added to the remap block list. The remap block on the FlashDisk is updated with the new list and both copies of the FAT are also updated.

It will be understood that the above description of the present invention is susceptible to various modifications, changes and adaptations, and the same are intended to be comprehended within the meaning and range of equivalents of the appended claims.

What is claimed is:

1. A method of operating a main computer having a processing system for executing programs for controlling said main computer and a floppy disk drive unit coupled to a main computer floppy disk drive port for receiving diskettes, said method comprising the steps of:
   determining by said processing system a type of diskette inserted into said floppy disk drive port;
   executing program instructions for accessing a first type of diskette if said processing system determines that said first type of diskette has been inserted into said main computer floppy disk drive port;
   executing program instructions for accessing a second type of diskette having a digital processor and a digital memory embodied therein if said processing system determines that said second type of diskette has been inserted into said main computer floppy disk drive port; and
   wherein said second type of diskette includes an inserting port for receiving a removable memory for a digital device, said digital device comprising a digital camera.

2. A method according to claim 1, wherein said first type of diskette is a standard floppy diskette.

3. A method according to claim 1, wherein said main computer is a personal computer.

4. A method according to claim 1, further including the step of determining if a diskette has been changed by user.

5. A method according to claim 1, including the step of accessing a boot sector from the diskette inserted into said main computer floppy disk drive port.

6. A method according to claim 1, wherein said step of executing program instructions for accessing a second type of diskette includes the step of writing to a flash memory device embodied on said second type of diskette inserted into said main computer floppy disk drive port.

7. A method according to claim 1, wherein said step of executing program instructions for accessing a second type of diskette includes the step of reading from a flash memory device embodied on said second type of diskette inserted into said main computer floppy disk drive port.

8. A method according to claim 7, wherein said flash memory device is a removable memory for a digital camera.

9. A method according to claim 1, wherein said executing steps are performed by main computer device driver software.

10. A method according to claim 1, further including the steps of:
    reading information from a boot sector of a diskette inserted into said floppy disk drive port; and
    determining information about the diskette from the information accessed from said boot record.

11. A method according to claim 1, fiterer including the step of transferring information representing image data captured by a digital camera and stored in a removable memory in said second type of diskette to said main computer.

12. A method according to claim 11, where the image data is accessible as files on the removable memory device.

13. A method according to claim 11, where the image data is accessible as files on the removable memory device and further including the step of producing a list of the files on the removable memory device.

14. A method according to claim 11, further including the step of copying data from the removable memory device to another memory device within the main computer.

15. A method according to claim 11, further including the step of deleting data from the removable memory device.

16. A method according to claim 11, further including the step of displaying data stored on the removable memory device on a display associated with the main computer.

17. A method according to claim 11, further including the steps of reading, writing, editing and displaying the image data stored on the removable memory device.

18. A method according to claim 11, wherein said information representing image data captured by a digital camera is accessible by the main computer user using standard disk operations of the main computer operating system.

19. A method of operating a main computer having a processing system for executing programs for controlling said main computer and a floppy disk drive unit coupled to a main computer floppy disk drive port for receiving diskettes, said method corising the steps of:
    determining by said processing system a type of diskette inserted into said floppy disk drive port;
    executing program instructions for accessing a first type of diskette if said processing system determines that said first tye of diskette has been inserted into said main computer floppy disk drive port;
    executing program instructions for accessing a second type of diskette having a digital processor and a digital memory embodied therein if said processing system determines that said second type of diskette has been inserted into said main computer floppy disk drive port;

transferring information representing image data captured by a digital camera and stored in a removable memory in said second type of diskette to said main computer; and wherein said step of transferring information representing image data captured by a digital camera includes the step of converting said information into an MFM analog signal.

20. A method of transferring digital data from a digital camera to a personal computer having at least one disk drive port, and a processing system for executing control programs for controlling said personal computer, said method of transferring comprising the steps of:

removing from a digital camera a removable memory storing information representing image data captured by said digital camera;

inserting said removable memory into an insertion port of an intelligent type of diskette having a diskette-shaped frame, digital processing circuitry, and an interface for transferring data to said personal computer via a disk drive port of said personal computer embodied therein;

inserting said intelligent type of diskette into a disk drive port of said personal computer;

determining by, said personal computer processing system, a type of diskette inserted into said disk drive port in said inserting step;

executing program instructions for accessing information from the intelligent type of diskette having digital processing circuitry and an interface for transferring data to said personal computer via a disk drive port of said personal computer if said processing system determines that said intelligent type of diskette has been inserted into said personal computer disk drive port; and transferring information representing image data captured by said digital camera stored in said removable memory to said personal computer.

21. A method according to claim 20, further including the step of determining by said processing system if a diskette has been changed by a user.

22. A method according to claim 20, wherein said determining step includes the step of accessing a boot sector from the intelligent diskette inserted into said disk drive port.

23. A method according to claim 20, wherein said removable memory includes a flash memory device and wherein said step of executing program instructions includes the step of writing to said flash memory device.

24. A method according to claim 20, wherein said removable memory includes a flash memory device and wherein said step of executing program instructions includes the step of reading from said flash memory device.

25. A method according to claim 20, wherein said determining and executing steps are performed by personal computer device driver software.

26. A method according to claim 20, wherein said determining step includes the steps of:

reading information from a boot sector of said intelligent diskette; and determining information about the diskette from the information accessed from said boot record.

27. A method according to claim 20, where the image data is accessible as files on the removable memory device.

28. A method according to claim 20, where data is accessible as files on the removable memory device and further including the step of producing a list of the files on the removable memory device.

29. A method according to claim 20, further including the step of copying data from the removable memory device to another memory device with the personal computer.

30. A method according to claim 20, further including the step of deleting data from the removable memory device.

31. A method according to claim 20, further including the step of displaying data stored on the removable memory device on a display associated with the personal computer.

32. A method according to claim 20, further including the steps of reading, writing, editing and displaying image data stored on the removable memory device.

* * * * *